United States Patent
Goldberg et al.

(10) Patent No.: US 8,438,513 B1
(45) Date of Patent: May 7, 2013

(54) QUANTIFIER ELIMINATION BY DEPENDENCY SEQUENTS

(75) Inventors: Evgueni I. Goldberg, Boston, MA (US); Panagiotis Manolios, Sharon, MA (US)

(73) Assignee: Northeastern University, Boston, MA (US)

(*) Notice: Subject to any disclaimer, the term of this patent is extended or adjusted under 35 U.S.C. 154(b) by 0 days.

(21) Appl. No.: 13/341,564

(22) Filed: Dec. 30, 2011

(51) Int. Cl.
*G06F 17/50* (2006.01)

(52) U.S. Cl.
USPC ............ 716/106; 716/101; 716/104; 716/132

(58) Field of Classification Search .................. 716/101, 716/104, 106, 132
See application file for complete search history.

(56) References Cited

U.S. PATENT DOCUMENTS

| | | | | |
|---|---|---|---|---|
| 6,247,164 | B1* | 6/2001 | Ashar et al. | 716/104 |
| 6,651,234 | B2* | 11/2003 | Gupta et al. | 716/106 |
| 6,816,825 | B1* | 11/2004 | Ashar et al. | 703/14 |
| 6,912,700 | B1* | 6/2005 | Franco et al. | 716/103 |
| 7,305,637 | B2* | 12/2007 | Ganai et al. | 716/103 |
| 7,356,519 | B1* | 4/2008 | Goldberg et al. | 706/45 |
| 7,440,942 | B2* | 10/2008 | Dixon et al. | 1/1 |
| 7,577,625 | B2* | 8/2009 | Zhang | 706/19 |
| 7,610,570 | B1* | 10/2009 | Goldberg | 716/100 |
| 8,141,048 | B2* | 3/2012 | Baumgartner et al. | 717/126 |
| 2004/0049474 | A1* | 3/2004 | Shankar et al. | 706/46 |
| 2010/0205574 | A1* | 8/2010 | Anai et al. | 716/5 |

OTHER PUBLICATIONS

Biere, A., "PicoSAT Essentials," Journal on Satisfiability, Boolean Modeling and Computation, vol. 4 No. 2-4, Sep. 2008, pp. 75-97.

Brauer, J. et al., "Existential Quantification as Incremental SAT," Proceedings of the 23rd International Conference on Computer Aided Verification, Jul. 14-20, 2011, 16 pages.

Bryant, R., "Graph-based algorithms for Boolean Function Manipulation 12," IEEE Transactions on Computers, vol. C-35 No. 8, Aug. 1986, pp. 677-691.

Clarke, E. et al, "Model Checking," MIT Press, 2000, 1 page.

Davis, M. et al., "A computing procedure for quantification theory," Journal of the ACM, vol. 7 No. 3, Jul. 1960, pp. 201-215.

Ganai, M., "Propelling SAT and SAT-based BMC using Careset," Proceedings of Formal Methods in Computer Aided Design, Oct. 20-23, 2010, pp. 231-238.

Ganai, M. et al., "Efficient SAT-based unbound symbolic model checking using circuit cofactoring," Proceedings of the ACM International Conference on Computer-Aided Design, Nov. 7-11, 2004, pp. 510-517.

Goldberg, E. et al., "SAT-solving based on boundary point elimination," Proceedings of the Haifa Verification Conference 2010, Haifa, Israel, LNCS 6504, Oct. 2010, pp. 93-111.

(Continued)

*Primary Examiner* — Naum Levin
(74) *Attorney, Agent, or Firm* — Withrow & Terranova, P.L.L.C.

(57) ABSTRACT

A new method is presented for eliminating existential quantifiers from a Boolean CNF (Conjunctive Normal Form) formula. This new method designs circuits by solving a quantifier elimination problem (QEP) by using derivation of dependency sequents (DDS). This new method begins with a first quantified conjunctive normal form formula, determines dependency sequents for the left branch and the right branch of a branching variable, resolves dependency sequents derived in both branches, and designs a circuit using a current formula having less variables than the first quantified conjunctive normal formula. Utility of this method includes verification, in particular, determining reachability of a state of a design.

25 Claims, 5 Drawing Sheets

OTHER PUBLICATIONS

Goldberg, E. et al., "Using problem symmetry in search based satisfiability algorithms," Proceedings of the conference on Design, Automation, and Test in Europe, Mar. 2002, pp. 134-141.

Goldberg, E. et al., "Boundary points and resolution," in Advanced Techniques in Logic Synthesis, Optimizations and Applications edited by S. Khatri and K. Gulati, Springer, Dec. 3, 2010, pp. 109-128.

Jin, H. et al., "Prime clauses for fast enumeration of satisfying assignments to Boolean circuits," proceedings of the 42nd Design Automation Conference, Jun. 13-17, 2005, pp. 750-753.

McMillan, K. "Interpolation and SAT-based model checking," Proceedings of the International Conference on Computer Aided Verification, Jul. 2003, LNCS, vol. 2725, pp. 1-13.

McMillan, K., "Applying SAT methods in unbounded symbolic model checking," Proceedings of the International Conference on Computer Aided Verification, Jul. 27-31, 2002, pp. 250-264.

McMillan, K., "Symbolic model checking," Kluwer Academic Publishers, 1993, 1 page.

HWMCC-2010 Benchmarks, 1 page, Accessed Apr. 27, 2012, http://fmc.jku.at/hwmcc10/benchmarks.html.

Goldberg, E. et al., "Quantifier Elimination by Dependency Sequents," SRC, Publication P060164, Jun. 4, 2011, 16 pages.

Manolios, P. et al., "Decision Procedures for System-level Verification," Oct. 2008, Presented at the Annual (SRC) review 2010, (Pub. P055473), 22 pages.

Manolios, P. et al., "Decision Procedures for System-level Verification," Oct. 2008, Presented at the Annual (SRC) review 2011, (Pub. P059425), 25 pages.

Goldberg, E. et al., "Report and prototype implementation of an algorithm for elimination of existential quantifiers," May 31, 2011, 2 pages.

\* cited by examiner

QUANTIFIER ELIMINATION BY DEPENDENCY SEQUENTS

CROSS-REFERENCE TO RELATED APPLICATIONS

This application is not related to any other applications. This application does not claim priority to any previous applications. This research was funded in part by the SRC contract 2008-TJ-1852.

FIELD OF THE INVENTION

The present invention relates to eliminating quantified variables by dependency sequents from a Boolean conjunctive normal form (CNF) formula for hardware/software design, verification, and model checking. A Dependency Sequent is an expression recording the fact that all the boundary points of a particular kind are eliminated from a cube of the search space.

BACKGROUND OF THE INVENTION

Electronic circuits have become ubiquitous in modern society. The electronics industry routinely announces accelerated clocking speeds, higher transmission frequencies, and more complex integrated circuit modules. While the benefits of these devices are myriad, the sheer complexity is becoming overwhelming. Design and verification of such devices requires the development of efficient algorithms for solving formulas describing design properties. An important class of formulas that needs to be solved efficiently is quantified Boolean formulas.

Additional background may be found in the following references, which are hereby incorporate in their entirety: A. Biere, "PicoSAT Essentials", *JSAT,* vol. 4, no. 2-4, pp. 75-97, 2008; J. Brauer, A. King, and J. Kriener, "Existential Quantification as Incremental SAT", *Proc. CAV*-2011; R. Bryant, "Graph-Based Algorithms for Boolean Function Manipulation", *IEEE Trans. on Computers,* vol. C-35, no. 8, pp. 677-691, 1986; E. Clarke, O. Grumberg, and D. Peled. *Model Checking,* MIT Press, 2000; M. Davis, and H. Putnam, "A Computing Procedure for Quantification Theory", *J. ACM,* vol. 7, no. 3, pp. 201-215, July, 1960; M. Ganai, "Propelling SAT and SAT-based BMC using Careset", in *Proc. FMCAD*-2010, pp. 231-238; M. Ganai, A. Gupta, and P. Ashar, "Efficient SAT-based unbounded symbolic model checking using circuit cofactoring", in *Proc. ICCAD*-2004, pp. 510-517; E. Goldberg, and P. Manolios, "SAT-solving Based on Boundary Point Elimination", in *Proc. HVC*-2010, LNCS vol. 6504, pp. 93-111; E. Goldberg, M. Prasad, and R. Brayton, "Using Problem Symmetry in Search Based Satisfiability Algorithms", in *DATE*-2002, pp. 134-141; E. Goldberg, "Boundary points and resolution", in *Proc. SAT*-2009, LNCS, vol. 5584, pp. 147-160; H. Jin, and F. Somenzi, "Prime clauses for fast enumeration of satisfying assignments to Boolean circuits," in *Proc. DAC*-2005, pp. 750-753; K. McMillan, "Interpolation and SAT-Based Model Checking," in *Proc. CAV*-2003, LNCS, vol. 2725, pp. 1-13; K. McMillan, "Applying SAT Methods in Unbounded Symbolic Model Checking," in *Proc. CAV*-2002, pp. 250-264; K. McMillan, *Symbolic Model Checking,* Kluwer Academic Publishers, 1993; HWMCC-2010 benchmarks, http://fmv.jku.at/hwmcc10/benchmarks.html.

SUMMARY OF THE INVENTION

A new method is presented for eliminating existential quantifiers from a Boolean CNF (Conjunctive Normal Form) formula. This new method analyzes and transforms circuits by solving a quantifier elimination problem (QEP) by using dependency sequents (DDS). This method begins with a quantified conjunctive normal form formula, then determines dependency sequents for the left branch and the right branch of a branching variable, then determines whether both branches of the branching variable are unsatisfied, and then designs a circuit having less variables than the quantified conjunctive normal formula given as input. The term "analyzes and transforms a circuit" is defined broadly as comprising any single step in a design process or during system-level verification, including, for example: determining forward and backward reachability queries of a set of states of a circuit model, synthesizing circuits, property and assertion checking, and model checking.

A Dependency Sequent is an expression recording the fact that all the boundary points of a particular kind are eliminated from a cube of the search space.

Those skilled in the art will appreciate the scope of the present invention and realize additional aspects thereof after reading the following detailed description of the preferred embodiments in association with the accompanying drawing figures.

DETAILED DESCRIPTION OF THE DRAWINGS

Figure 1:
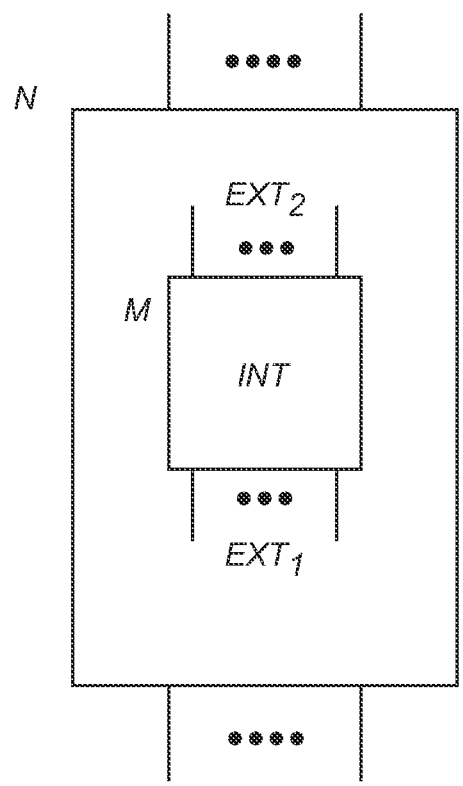
FIG. 1 is block diagram illustrating a subcircuit located inside of a main circuit.

FIG. 1 is a drawing illustrating application of quantified Boolean formulas. Let a combinational subcircuit M be located inside of a main circuit N. Subcircuit M interacts (inputs and outputs) with other subcircuits (or with the outside world) through external variables $Ext_1$ and $Ext_2$. Additionally, subcircuit M has internal variables Int indicating the state of internal components. Let Boolean formula $F_M(Ext_1, Ext_2, Int)$ describe the behavior of subcircuit M. The formula $\exists Int. F_M(Ext_1, Ext_2, Int)$ where the variables of Int are bound by existential quantifiers abstracts away the internal behavior of subcircuit M.

Figure 2A:
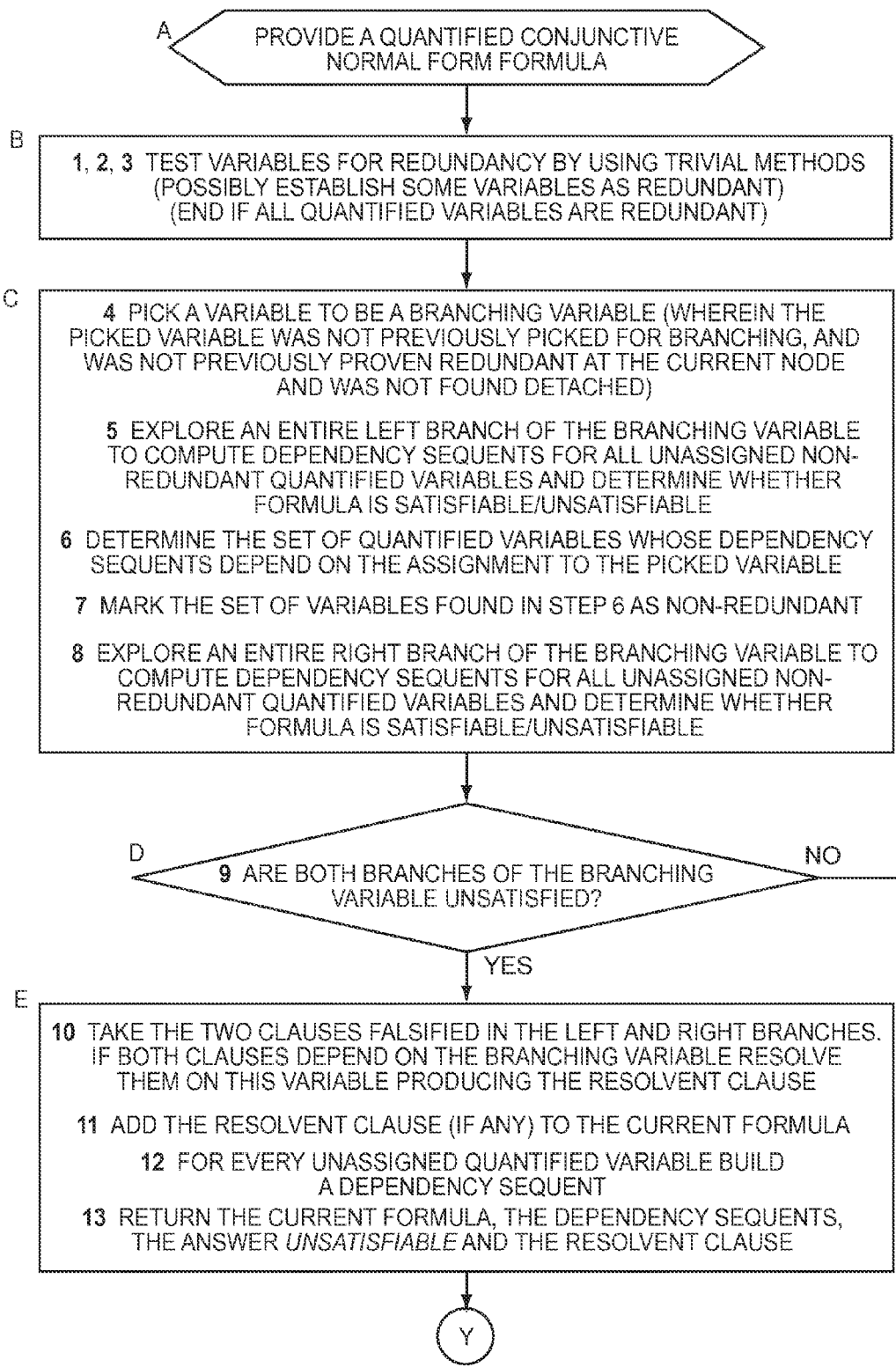
FIG. 2A is a block diagram illustrating a first portion of a high-level description of Derivation of Dependency Sequents (DDS).
Figure 2B:
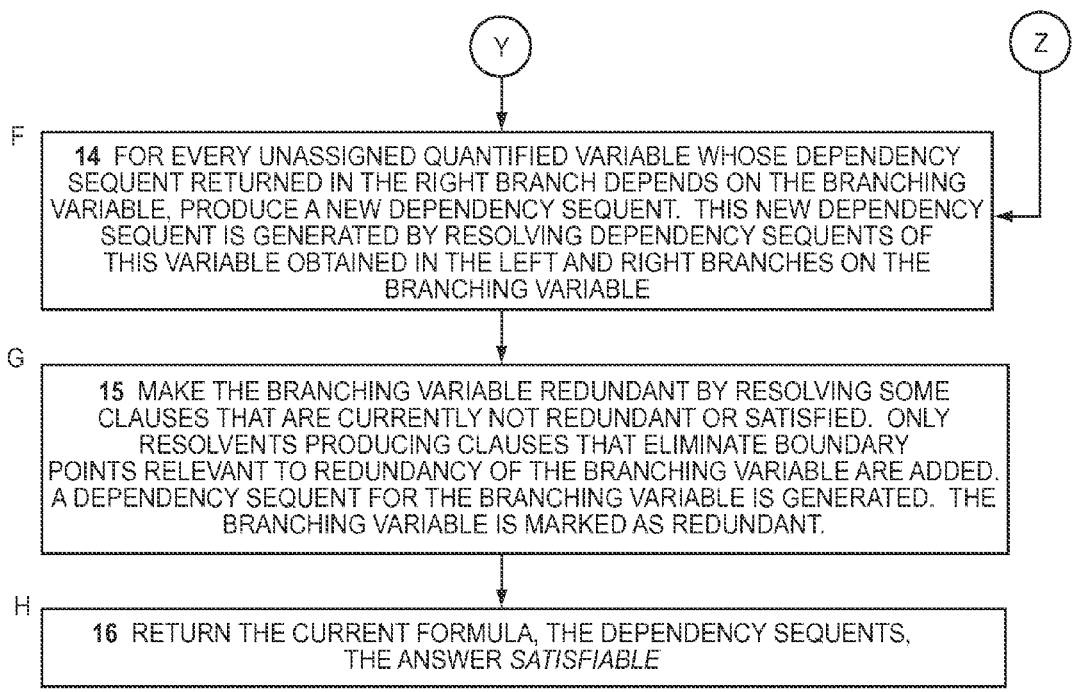
FIG. 2B is a block diagram illustrating a second portion of a high-level description of Derivation of Dependency Sequents (DDS).

FIGS. 2A and 2B are a block diagram illustrating a high-level description of Derivation of Dependency Sequents (DDS).

Regarding notation, this diagram uses simplified notation for dependency sequents as follows: q→{x}. Applicants will call q the "assignment part" of this dependency sequent (or D-sequent). When Applicants say a "D-sequent of variable x ," Applicants mean a D-sequent whose right part is {x}. Further, a clause is described as "redundant" if it contains a variable proved redundant.

DDS maintains the following invariant: DDS backtracks only if the following two conditions are true:
every variable of X (i.e. every quantified variable of formula ξ) is either assigned a value or proved redundant, and for every redundant variable of X there is a dependency sequent g→{x} where the assignment part g may include only (some) assignments of q i.e. made on the path to the current node of the search tree.

A variable y of Y (i.e. a non-quantified variable) is called "detached" if every clause of F that contains y and a variable of X is:

either satisfied by the current assignment q or
contains a variable of X proved redundant in the current node of the search tree.

See sections 1 and 2 for additional discussion of the notation, and additional definitions.

Illustrative pseudocode for FIGS. 2A and 2B is provided below.

```
// ξ denotes ∃X.F(X,Y) DDS(ξ,q){
1 (ans,C, D*_seq)←leaf_D_sequents(ξ,q);
2 If (ans=unsat) return(ξ, D*_seq,unsat,C);
3 if (ans=sat) return(ξ, D*_seq,sat);
4 v:=pick_variable(F);
5 (ξ, D_seq, ans', C')←DDS(ξ,q ∪{(v=0)};
6 (V'_red, D'_seq)←find_dependent(F, D_seq, v);
7 unmark_redundand_vars(V'_red);
8 (ξ, D"_seq, ans", C")←DDS(ξ,q∪{(v=1)};
9 if ((ans'=unsat) and (ans"=unsat)){
10  C:=resolve_clauses(C',C",v);
11  F:=F∪{C};}
12 D_seq=process_falsified_clause(F,C);
13 return(ξ, D_seq∪D*_seq, unsat, C);}
14 D_seq=resolve_D_sequents(D'_seq,D"_seq,v);
15 (F,S)←make_variable_redund(F,v);
16 return(ξ, D_seq∪D*_seq∪{S}, sat);}
```

In FIGS. 2A and 2B, the numbers in the blocks refer to the line numbers of the above pseudocode. Step A provides a quantified conjunctive normal form (CNF) formula. This formula may model a proposed circuit or subcircuit design, as shown in FIG. 1.

Step B tests variables for redundancy using "trivial" (relatively easy or inexpensive) methods. The purpose of step B is to attempt to simplify the problem by identifying at some of the redundant variables using relatively easy methods. Step B corresponds to lines 1-3 of the above pseudocode, and is illustrated in more detail in FIG. 3 below.

Step C performs lines 4-8 of the above pseudocode which determines dependency sequents for the left branch and the right branch of a branching variable. Line 4 picks a variable to be a branching variable, wherein the picked variable was not previously picked for branching, and was not previously proven redundant at a current node, and was not found detached.

In step C, line 5 explores an entire left branch of the branching variable to compute dependency sequents for all unassigned non-redundant quantified variables and determine whether the formula is satisfiable or unsatisfiable.

In step C, line 6 determines a set of quantified variables whose dependency sequents depend on the assignment to the picked variable.

In step C, line 7 marks the set of variables found in step 6 as non-redundant.

In step C, line 8 explores an entire right branch of the branching variable to compute dependency sequents for all unassigned non-redundant quantified variables and determine whether the formula is satisfiable or unsatisfiable.

In step D, line 9 determines whether both branches of the branching variable are unsatisfiable.

Step E (upon a determination of "yes" in step D), performs lines 10-13 of the above pseudocode, and builds a dependency sequent for every unassigned quantified variable.

In step E, line 10 evaluates the two clauses falsified in the two branches. If both clauses depend on the branching variable, then resolve both clauses on the branching variable to produce a resolvent clause.

In step E, line 11 adds the resolvent clause (if any), to a current formula.

In step E, line 12 builds a dependency sequent for every unassigned quantified variable.

In step E, line 13 returns the current formula, the dependency sequents, the answer "unsatisfiable," and the resolvent clause.

Step F performs line 14 of the above pseudocode. Line 14 produces a new dependency sequent for every unassigned quantified variable whose dependency sequent was returned in the exploration of the right branch and depends on the branching variable. Wherein this new dependency sequent is generated by resolving dependency sequents of this variable obtained in the left and right branches on the branching variable.

Step G performs line 15 of the above pseudocode. Line 15 makes the branching variable redundant by resolving clauses that are currently not redundant or satisfied on this variable. Note that "currently not redundant or satisfied" means "currently not redundant and currently not satisfied." In other words, Only resolvents producing clauses that eliminate boundary points relevant to redundancy of the branching variable are added. A dependency sequent for the branching variable is generated. The branching variable is marked as redundant.

Step H performs line 16 of the above pseudocode. Line 16 returns the current formula, the dependency sequents, and the answer "satisfiable."

Figure 3:
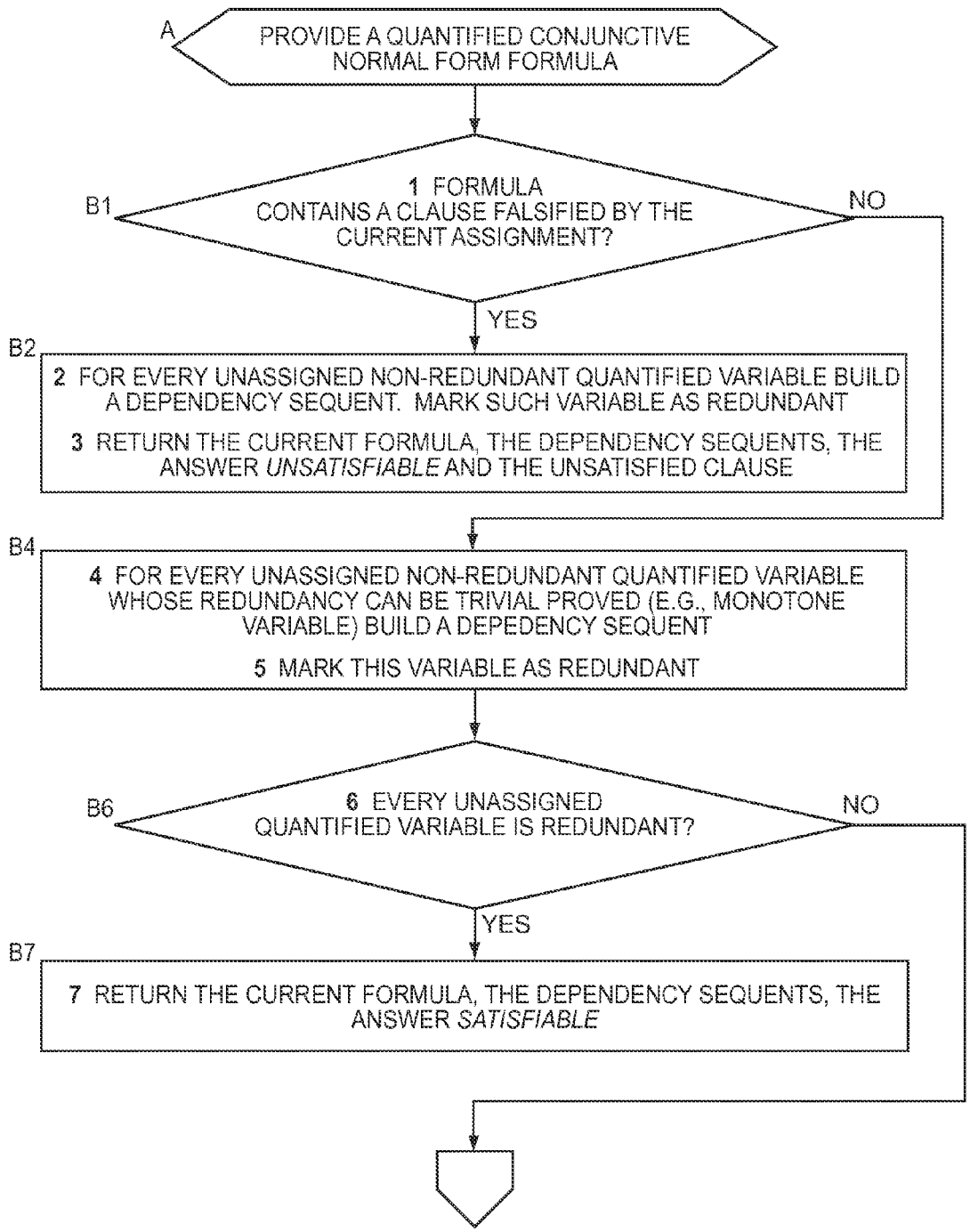
FIG. 3 is a block diagram illustrating generation of leaf-D sequents.

FIG. 3 is a block diagram illustrating generation of leaf-D sequents (and provides additional detail corresponding to step B of FIG. 2). Illustrative pseudocode for FIG. 3 is provided below.

```
leaf_D_sequents(ξ,q){
1 if (a clause C of F is falsified by q) {
2  D_seq=process_falsified_clause(F,C);
3  return(ξ, D_seq, unsat, C);}
4 (V_red, D_seq)←find_redund_vars(F, q);
5 mark_redundand_vars(V_red);
6 if (all_unassigned_vars_redund(F)) return(ξ, D_seq, sat);
7 return(ξ, D_seq, unknown);}
```

Step A provides a quantified conjunctive normal form (CNF) formula, as discussed above with respect to FIG. 2. Steps B1 through B7 provide additional detail for step B in FIG. 2.

Step B1 illustrates line 1 of the above pseudocode, and determines whether the formula contains a clause falsified by a current assignment.

Step B2 (upon a determination of "YES" in step B1), illustrates lines 2 and 3 of the above pseudocode. Line 2 builds a dependency sequent for and marks as redundant every unassigned non-redundant quantified variable. Line 3 returns the current formula, the dependency sequents, the answer unsatisfiable, and the unsatisfied clause.

Step B4 (upon a determination of "NO" in step B1), illustrates lines 4 and 5 of the above pseudocode. Line 4 builds a dependency sequent for every unassigned non-redundant variable whose redundancy can be trivially proved (e.g. a monotone variable). Line 5 marks this variable as redundant.

Step B6 illustrates line 6 in the above pseudocode. Line 6 determines whether every unassigned quantified variable is redundant.

Step B7 (upon a determination of "YES" in step B6), illustrates line 7 in the above pseudocode. Line 7 returns the current formula, the dependency sequents, and the answer satisfiable.

Step F (upon a determination of "NO" in step B6), returns to step F of FIG. 2 for additional processing.

Figure 4:
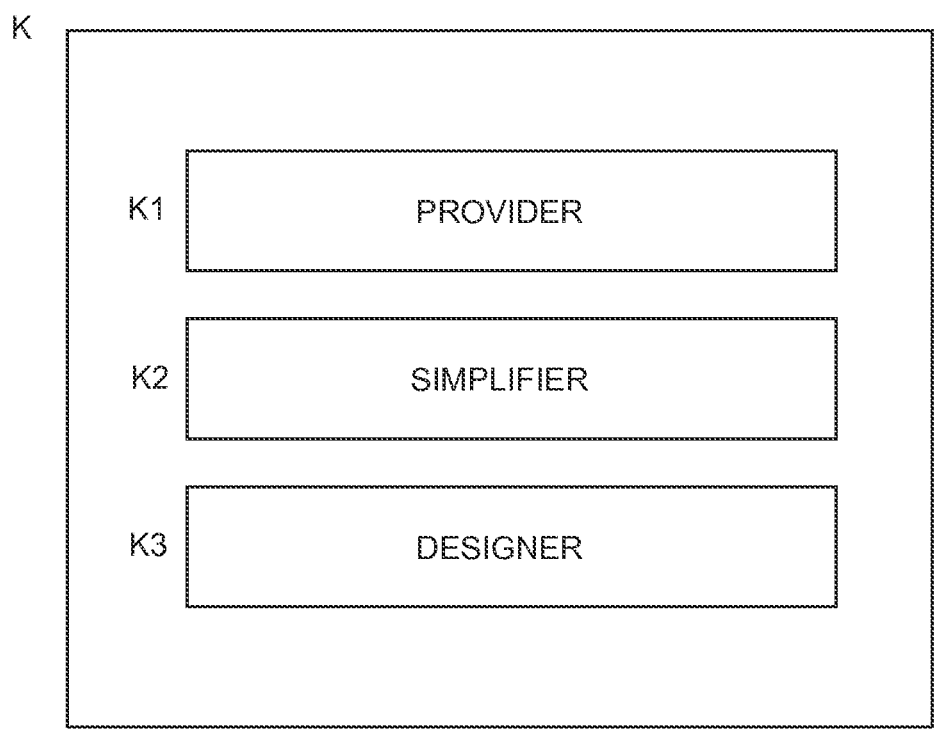
FIG. 4 is a design apparatus configured to perform Derivation of Dependency Sequents (DDS).

FIG. 4 is a design apparatus configured to perform Derivation of Dependency Sequents (DDS). In FIG. 4, design apparatus K comprises four portions: provider K1, first determiner K2, second determiner K3, and designer K4.

Design apparatus K is configured to design a circuit by solving a quantifier elimination problem (QEP) by boundary point elimination (BPE) using derivation of dependency sequents (DDS). Provider K1 is configured to provide a first quantified conjunctive normal form formula. Simplifier K2 is configured to use DDS to simplify this formula by eliminating the quantifiers. Designer K3 is configured to use the obtained formula where all quantified variables are removed, for designing a circuit.

The four portions of design apparatus G comprise hardware, and/or comprise computer readable media containing computer executable instructions which, when performed by a microprocessor, cause associated steps to be performed.

SECTION 1. Introduction

This new method designs circuits by solving a quantifier elimination problem (QEP) by boundary point elimination (BPE) using derivation of dependency sequents (DDS). This method begins with a first quantified conjunctive normal form formula and then eliminates quantified variables from this formula by computing dependency sequents. The term "designs a circuit" is defined broadly as comprising any single step in the design process, including, for example: verification, determining reachability of a state of a circuit model, or other model checking.

As discussed above, Applicants are concerned with the problem of elimination of existential quantified variables from a Boolean CNF formula. (Since Applicants consider only existential quantifiers, further on Applicants omit the word "existential".) Namely, Applicants solve the following problem: given a Boolean CNF formula $\exists X.F(X,Y)$, find a Boolean CNF formula $F^*(Y)$ such that $F^*(Y) \equiv \exists X.F(X,Y)$. Applicants will refer to this problem as QEP (Quantifier Elimination Problem). Since QEP is to find a formula, it is not a decision problem as opposed to the problem of solving a Quantified Boolean Formula (QBF).

A straightforward method of solving QEP for CNF formula $\exists X.F(X,Y)$ is to eliminate the variables of X one by one, in the way it is done in the DP procedure. "DP" stands for Davis and Putman (Martin Davis and Hilary Putman), the authors of the procedure. To delete a variable $x_i$ of X, the DP procedure produces all possible resolvents on variable $x_i$ and adds them to F. An obvious drawback of such a method is that it generates a prohibitively large number of clauses. Another set of QEP-solvers employs the idea of enumerating satisfying assignments of formula F(X,Y). Here is how a typical method of this kind works. First, a CNF formula $F^+(Y)$ is built such that each clause C of $F^+$ (called a blocking clause) eliminates a set of assignments satisfying F(X,Y). By negating $F^+(Y)$ one obtains a CNF formula $F^*(Y)$ that is a solution to QEP.

Unfortunately, $F^+$ may be exponentially larger than $F^*$. This occurs, for instance, when $F(X,Y)=F_1(X_1,Y_1) \wedge \ldots \wedge F_k(X_k,Y_k)$ and $(X_i \cup Y_i) \cap (X_j \cup Y_j) = \emptyset$, $i \neq j$ that is when F is the conjunction of independent CNF formulas $F_i$. In this case, one can build $F^*(Y)$ as $F^*_1 \wedge \ldots \wedge F^*_k$, where $F^*_i(Y_i) \equiv \cup X_i.F_i(X_i,Y_i)$, i=1, ... k. So the size of $F^*$ is linear in k whereas that of $F^+$ is exponential in k. This fact implies that QEP-solvers based on enumeration of satisfying assignments are not compositional. (Applicants say that a QEP-solver is compositional if it reduces the problem of finding $F^*(Y)$ to k independent subproblems of finding $F^*_i(Y_i)$, i=1, . . . , k.) Note that in practical applications, it is very important for a QEP-solver to be compositional. Even if F does not break down into independent subformulas, there may be numerous branches of the search tree where such subformulas appear.

Both kinds of QEP-solvers mentioned above have the same drawback. A resolution-based QEP-solver can only efficiently check if a clause C of $F^*(Y)$ is correct i.e. whether it is implied by F(X,Y). But how does one know if $F^*$ contains a sufficient set of correct clauses, i.e. whether every assignment y satisfying $F^*$ can be extended to (x,y) satisfying F. A non-deterministic algorithm does not have to answer this question. Once a sufficient set of clauses is derived, an oracle stops this algorithm. But a deterministic algorithm has no oracle and so has to decide for itself when it is the right time to terminate. One way to guarantee the correctness of termination is to enumerate the satisfying assignments of F. The problem here is that then, the size of a deterministic derivation of $F^*$ may be exponentially larger than that of a non-deterministic one. (Non-compositionality of QEP-solvers based on enumeration of satisfying assignments is just a special case of this problem.)

In this application, Applicants introduce a new termination condition for QEP that is based on the notion of boundary points. A complete assignment p falsifying F(X,Y) is an X'-boundary point where $X' \subset X$ if a) every clause of F falsified by p has a variable of $\overline{X'}$ and b) first condition breaks for every proper subset of X'. An X'-boundary point p is called removable if no satisfying assignment of F can be obtained from p by changing values of variables of X. One can eliminate a removable X'-boundary point by adding to F a clause C that is implied by F and does not have a variable of X'. If for a set of variables X" where $X" \subset X$, formula F(X,Y) does not have a removable X'-boundary point where $X' \subset X"$, the variables of X" are redundant in formula $\exists X.F(X,\overline{Y})$. This means that every clause with a variable of X" can be removed from F(X,Y). QEP-solving terminates when the current formula F(X,Y) (consisting of the initial clauses and resolvents) has no removable boundary points. A solution $F^*(Y)$ to QEP is formed from F(X,Y) by discarding every clause that has a variable of X.

The new termination condition allows one to address drawbacks of the QEP-solvers mentioned above. In contrast to the DP procedure, only resolvents eliminating a boundary point need to be added. This dramatically reduces the number of resolvents one has to generate. On the other hand, a solution $F^*$ can be derived directly without enumerating satisfying assignments of F. In particular, using the new termination condition makes a QEP-solver compositional.

To record the fact that all boundary removable points have been removed from a subspace of the search space, Applicants introduce the notion of a dependency sequent (D-sequent for short). Given a CNF formula F(X,Y), a D-sequent has the form $(F, X', q) \rightarrow X"$ where q is a partial assignment to variables of X, $X' \subset X$, $X" \subset X$. Let $F_q$ denote formula F after assignments q are made. Applicants say that the D-sequent above holds if the variables of X' are redundant in $F_q$,
the variables of X" are redundant in the formula obtained from $F_q$ by discarding every clause containing a variable of X'.

The fact that the variables of X' (respectively X") are redundant in F means that F has no removable $X^*$-boundary point where $X^* \subseteq X'$ (respectively $X^* \subseteq X"$). The reason for using name "D-sequent" is that the validity of $(F, X', q) \rightarrow X''$ suggests interdependency of variables of q, X' and X".

In a sense, the notion of a D-sequent generalizes that of an implicate of formula $F(X,Y)$. Suppose, for instance, that $F \rightarrow C$ where $C = x_1 \vee x_2$, $x_1 \in X$, $x_2 \in X$. After adding C to F, the D-sequent $(F, \emptyset, q) \rightarrow x'$ where $q = (x_1 = 0, x_2 = 0)$, $X' = X \setminus \{x_1, x_2\}$ becomes true. (An assignment falsifying C makes the unassigned variables of F redundant.) But the opposite is not true. The D-sequent above may hold even if $F \rightarrow C$ does not. (The latter means that q can be extended to an assignment satisfying F).

Applicants will refer to the method of QEP-solving based on elimination of boundary points as DDS (Derivation of D-Sequents). Applicants will refer to the QEP-solver based on the DDS method Applicants describe in this application as DDS_impl (DDS implementation). To reflect the progress in elimination of boundary points of F, DDS_impl uses resolution of D-sequents. Suppose D-sequents $(F,\emptyset,q_1) \rightarrow \{x_{10}\}$ and $(F,\emptyset,q_2) \rightarrow \{x_{10}\}$ have been derived where $q_1 = (x_1=0, x_3=0)$ and $q_2 = (x_1=1, x_4=0)$. Then a new D-sequent $(F,\emptyset,q) \rightarrow \{x_{10}\}$ where $q = (x_3=0, x_4=0)$ can be produced from them by resolution on variable $x_1$. DDS_impl terminates as soon as D-sequent $(F,\emptyset,\emptyset) \rightarrow X$ is derived, which means that the variables of X are redundant in F (because every removable X'-boundary point where $X' \subset X$ has been eliminated from F due to adding resolvent-clauses).

This application is structured as follows. In Section 2, Applicants define the notions related to boundary points. The relation between boundary points and QEP is discussed in Section 3. Section 4 describes how adding/removing clauses affects the set of boundary points of a formula. D-sequents are introduced in Section 5. Section 6 describes DDS_impl. The compositionality of DDS_impl and some pseudocode examples are discussed in Section 7. Section 8 describes experimental results. Some additional background is given in Section 9. Section 10 summarizes this application. Section 11 provides proofs.

SECTION 2. Basic Definitions

Notation: Let F be a CNF formula and C be a clause. Applicants denote by Vars(F) (respectively Vars(C)) the set of variables of F (respectively of C). If q is a partial assignment to Vars(F), Vars(q) denotes the variables assigned in q.

Notation: In this application, Applicants consider a quantified CNF formula $\exists X.F(X,Y)$ where $X \cup Y = \text{Vars}(F)$ and $X \cap Y = \emptyset$.

Definition 1 A CNF formula $F^*(Y)$ is a solution to the Quantifier Elimination Problem (QEP) if $F^*(Y) \equiv \exists X.F(X,Y)$.

Definition 2 Given a CNF formula $G(Z)$, a complete assignment to the variables of Z is called a point.

Definition 3 Let $G(Z)$ be a CNF formula and $Z' \subset Z$. A clause C of G is called a Z'-clause if $\text{Vars}(C) \cap Z' \neq \emptyset$. Otherwise, C is called a non-Z'-clause.

Definition 4 Let $G(Z)$ be a CNF formula and $Z' \subset Z$. A point p is called a Z'-boundary point of G if $G(p)=0$ and
1. Every clause of G falsified by p is a Z'-clause.
2. Condition 4 breaks for every proper subset of Z'.

A Z'-boundary point p is at least |Z'| flips away from a point $p^*$, $G(p^*)=1$ (if $p^*$ exists and only variables of Z' are allowed to be changed), hence the name "boundary".

Let p be a Z'-boundary point of $G(Z)$ where $Z'=\{z\}$. Then every clause of G falsified by p contains variable z. This special class of boundary points was introduced in [9, 10].

Definition 5 Point p is called a Z'-removable boundary point of $G(Z)$ where $Z' \subset Z$ if p is a Z"-boundary point where $Z" \subseteq Z'$ and there is a clause C such that p falsifies C;
C is a non-Z'-clause;
C is implied by the conjunction of Z'-clauses of G.
Adding clause C to G eliminates p as a Z"-boundary point (p falsifies clause C and C has no variables of Z").

Proposition 1 Point p is a Z'-removable boundary point of a CNF formula $G(Z)$ if no point $p^*$ obtained from p by changing values of (some) variables of Z' satisfies G.

The proofs are given in a separate section below.

Example 1 Let CNF formula G consist of four clauses: $C_1 = z_1 \vee z_2$, $C_2 = z_3 \vee z_4$, $C_3 = \overline{z_1} \vee z_5$, $C_4 = \overline{z_3} \vee z_5$. Let $p=(z_1=0, z_2=0, z_3=0, z_4=0, z_5=0)$. Point p falsifies only $C_1$ and $C_2$. Since both $C_1$ and $C_2$ contain a variable of $Z"=\{z_1,z_3\}$, p is a Z"-boundary point. (Note that p is also, for instance, a $\{z_2, z_4\}$-boundary point.) Let us check if point p is a Z'-removable boundary point where $Z'=\{z_1,z_3,z_5\}$. One condition of Definition 5 is met: p is a Z"-boundary point, $Z" \subset Z'$. However, the point $p^*$ obtained from p by flipping the values of $z_1$, $z_3$, $z_5$ satisfies G. So, according to Proposition 1, p is not a Z'-removable boundary point (i.e. the clause C of Definition 5 does not exist for p).

Definition 6 Applicants will say that a boundary point p of $F(X,Y)$ is just removable if it is X-removable.

Remark 1 Informally, a boundary point p of $F(X,Y)$ is removable only if there exists a clause C implied by F and falsified by p such that $\text{Vars}(C) \subset Y$. The fact that an X"-boundary point p is not X'-removable (where $X" \subset X'$) also means that p is not removable. The opposite is not true.

SECTION 3. X-Boundary Points and Quantifier Elimination

In this section, Applicants relate QEP-solving and boundary points. First Applicants define the notion of redundant variables in the context of boundary point elimination (Definition 7). Then Applicants show that monotone variables are redundant (Proposition 2). Then Applicants prove that clauses containing variables of X', $X' \subset X$ can be removed from formula $\exists X.F(X,Y)$ if and only if the variables of X' are redundant in F (Proposition 3).

Definition 7 Let $F(X,Y)$ be a CNF formula and $X' \subset X$. Applicants will say that the variables of X' are redundant in F if F has no removable X"-boundary point where $X" \subseteq X$.

Proposition 2 Let $G(Z)$ be a CNF formula and z be a monotone variable of F. (That is clauses of G contain the literal of z of only one polarity.) Then z is redundant in G.

Definition 8 Let $F(X,Y)$ be a CNF formula. Denote by $\text{Dis}(F,X')$ where $X' \subset X$ the CNF formula obtained from $F(X,Y)$ by discarding all X'-clauses.

Proposition 3 Let $F(X,Y)$ be a CNF formula and X' be a subset of X. Then $\exists X.F(X,Y) \equiv \exists(X \setminus X').\text{Dis}(F,X')$ if the variables of X' are redundant in F.

Corollary 1 Let $F(X,Y)$ be a CNF formula. Let $F^*(Y) = \text{Dis}(F,X)$. Then $F^*(Y) \equiv \exists X.F(X,Y)$ holds if the variables of X are redundant in F.

SECTION 4. Appearance of Boundary Points When Adding/Removing Clauses

In this section, Applicants give two theorems later used in Proposition 8 (about D-sequents built by DDS_impl). They describe the type of clauses one can add to (or remove from) $G(Z)$ without creating a new $\{z\}$-removable boundary point where $z \in Z$.

Proposition 4 Let $G(Z)$ be a CNF formula. Let G have no $\{z\}$-removable boundary points. Let C be a clause. Then the formula $G \wedge C$ does not have a $\{z\}$-removable boundary point if at least one of the following conditions hold: a) C is implied by G; b) $z \notin \text{Vars}(C)$.

Proposition 5 Let $G(Z)$ be a CNF formula. Let G have no $\{z\}$-removable boundary points. Let C be a $\{z\}$-clause of G. Then the CNF formula G' where $G' = G \setminus \{C\}$ does not have a $\{z\}$-removable boundary point.

Remark 2 According to Propositions 4 and 5, adding clause C to a CNF formula G or removing C from G may produce a new $\{z\}$-removable boundary point only if:
- one adds to G a $\{z\}$-clause C that is not implied by G or
- one removes from G a clause C that is not a $\{z\}$-clause.

SECTION 5. Dependency Sequents (D-sequents)

5.1 General Definitions and Properties

In this subsection, Applicants introduce D-sequents (Definition 10) and resolution of D-sequents (Definition 12). Proposition 6 states that a D-sequent remains true if resolvent-clauses are added to F. The soundness of resolving D-sequents is shown in Proposition 7.

Definition 9 Let F be a CNF formula and q be a partial assignment to Vars(F). Denote by $F_q$ the CNF formula obtained from F by
- removing the literals of (unsatisfied) clauses of F that are set to 0 by q,
- removing the clauses of F satisfied by q.

Definition 10 Let F(X,Y) be a CNF formula. Let q be a partial assignment to variables of X and X' and X'' be subsets of X such that Vars(q), X', X'' do not overlap. A dependency sequent (D-sequent) S has the form $(F, X', q) \to X''$. Applicants will say that S holds if
- the variables of X' are redundant in $F_q$ (see Definition 9),
- the variables of X'' are redundant in $Dis(F_q, X')$ (see Definition 8).

Example 2 Let CNF formula F(X,Y) where $X=\{x_1, x_2\}$, $Y=\{y_1, y_2\}$ consist of two clauses: $C_1=x_1 \vee y_1$ and $C_2=\overline{x}_1 \vee x_2 \vee y_2$. Note that variable $x_2$ is monotone and hence redundant in F (due to Proposition 2). After discarding the clause $C_2$ (containing the redundant variable $x_2$), variable $x_1$ becomes redundant. Hence, the D-sequent $(F, \{x_2\}, \emptyset) \to \{x_1\}$ holds.

Proposition 6 Let $F^+(X,Y)$ be a CNF formula obtained from F(X,Y) by adding some resolvents of clauses of F. Let q be a partial assignment to variables of X and $X' \subset X$. Then the fact that D-sequent $(F, X', q) \to X''$ holds implies that $(F^+, X', q) \to X''$ holds too. The opposite is not true.

Definition 11 Let F(X,Y) be a CNF formula and q', q'' be partial assignments to X. Let Vars(q')∩Vars(q'') contain exactly one variable x for which q' and q'' have the opposite values. Then the partial assignment q such that
- Vars(q)=((Vars(q')∪Vars(q''))\{x},
- the value of each variable $x^*$ of Vars(q) is equal to that of $x^*$ in Vars(q')∪Vars(q'').

is denoted as Res(q',q'',x) and called the resolvent of q',q'' on x. Assignments q' and q'' are called resolvable on x.

Proposition 7 Let F(X,Y) be a CNF formula. Let D-sequents $S_1$ and $S_2$ be equal to $(F, X_1, q_1) \to X'$ and $(F, X_2, q_2) \to X'$ respectively. Let $q_1$ and $q_2$ be resolvable on variable x. Denote by q the partial assignment $Res(q_1, q_2, x)$ and by $X^*$ the set $X_1 \cap X_2$. Then, if $S_1$ and $S_2$ hold, the D-sequent S equal to $(F, X^*, q) \to X'$ holds too.

Definition 12 Applicants will say that the D-sequent S of Proposition 7 is produced by resolving D-sequents $S_1$ and $S_2$ on variable x. S is called the resolvent of $S_1$ and $S_2$ on x.

5.2 Derivation of D-sequents in DDS_impl

In this subsection, Applicants discuss generation of D-sequents in DDS_impl (see Section 6). DDS_impl builds a search tree by branching on variables of X of F(X,Y).

Definition 13 Let $q_1$ and $q_2$ be partial assignments to variables of X. Applicants will denote by $q_1 \leq q_2$ the fact that a) Vars($q_1$) ⊂ Vars($q_2$) and b) every variable of Vars($q_1$) is assigned in $q_1$ exactly as in $q_2$.

Let q be the current partial assignment to variables of X and $X_{red}$ be the unassigned variables proved redundant in $F_q$. DDS_impl generates a new D-sequent a) by resolving two existing D-sequents or b) if one of the conditions below is true.

1) A (locally) empty clause appears in $Dis(F_q, X_{red})$. Suppose, for example, that F contains clause $C=x_1 \vee \overline{x}_5 \vee x_7$. Assume that assignments ($x_1=0$, $x_5=1$) are made turning C into the unit clause $x_7$. Assignment $x_7=0$ makes C an empty clause and so eliminates all boundary points of $Dis(F_q, X_{red})$. So DDS_impl builds D-sequent $(F, \emptyset, g) \to X'$ where $g=(x_1=0, x_5=1, x_7=0)$ and X' is the set of unassigned variables of $Dis(F_q, X_{red})$ that are not in $X_{red}$.

2) $Dis(F_q, X_{red})$ has only one variable x of X that is not assigned and is not redundant. In this case, DDS_impl makes x redundant by adding resolvents on variable x and then builds D-sequent $(F, X'_{red}, g) \to \{x\}$ where $X'_{red} \subset X_{red}$, $g \leq q$ and $X'_{red}$ and g are defined in Proposition 8 below (see also Remark 3).

3) A monotone variable x appears in formula $Dis(F_q, X_{red})$. Then DDS_impl builds D-sequent $(F, X'_{red}, g) \to \{x\}$ where, $X'_{red} \subset X_{red}$, $g \leq q$ and $X'_{red}$ and g are defined in Proposition 8 (see Remark 4).

Proposition 8 and Remark 3 below explain how to pick a subset of assignments of the current partial assignment q responsible for the fact that a variable x is redundant in branch q. This is similar to picking a subset of assignments responsible for a conflict in SAT-solving.

Proposition 8 Let F(X,Y) be a CNF formula and q be a partial assignment to variables of X. Let $X_{red}$ be the variables proved redundant in $F_q$. Let x be the only variable of X that is not in Vars(q)∪$X_{red}$. Let D-sequent $(F, X_{red}, g) \to \{x\}$ hold. Then D-sequent $(F, X'_{red}, g) \to \{x\}$ holds where g and $X'_{red}$ are defined as follows. Partial assignment g to variables of X satisfies the two conditions below (implying that $g \leq q$):

1. Let C be a $\{x\}$-clause of F that is not in $Dis(F_q, X_{red})$. Then either
   g contains an assignment satisfying C or
   D-sequent $(F, X^*_{red}, g^*) \to \{x^*\}$ holds where $g^* \leq g$, $X^*_{red} \subset X_{red}$, $x^* \in (X_{red} \cap Vars(C))$.

2. Let $p_1$ be a point such that $q \leq p_1$. Let $p_1$ falsify a clause of F with literal x. Let $p_2$ be obtained from $p_1$ by flipping the value of x and falsify a clause of F with literal $\overline{x}$. Then there is a non-$\{x\}$-clause C of F falsified by $p_1$ and $p_2$ such that $(Vars(C) \cap X) \subset Vars(g)$.

The set $X'_{red}$ consists of all the variables already proved redundant in $F_g$. That is every redundant variable $x^*$ of $X_{red}$ with D-sequent $(F, X^*_{red}, g^*) \to \{x^*\}$ such that $g^* \leq g$, $X^*_{red} \subset X_{red}$ is in $X'_{red}$.

Remark 3 When backtracking (and making new assignments) formula $Dis(F_q, X_{red})$ changes. Partial assignment g is formed so as to prevent the changes that may produce new $\{x\}$-boundary points. According to Remark 2, this may occur only in two cases.

The first case is adding an $\{x\}$-clause C to $Dis(F_q, X_{red})$. This may happen after backtracking if C was satisfied or contained a redundant variable. Condition 8 of Proposition 8 makes g contain assignments that prevent C from appearing.

The second case is removing a non-$\{x\}$-clause C from $Dis(F_q, X_{red})$. This may happen if C contains a literal falsified by an assignment in q and then this assignment is flipped. Condition 8 of Proposition 8 makes g contain assignments guaranteeing that a "mandatory" set of clauses preventing appearance of new $\{x\}$-boundary points is present when D-sequent $(F, X'_{red}, g) \to \{x\}$ is used.

Remark 4 If x is monotone, Condition 8 of Proposition 8 is vacuously true because $p_1$ or $p_2$ does not exist. So one can drop the requirement of Proposition 8 about x being the only variable of X that is not in Vars(q)∪$X_{red}$. (It is used only when proving that the contribution of non-{x}-clauses into g specified by Condition 8 is correct. But if x is monotone non-{x}-clauses are not used when forming g.)

5.3 Notation Simplification for D-sequents of DDS_impl

In the description of DDS_impl Applicants will use the notation g→X" instead of (F, X', g)→X". Applicants do this for two reasons. First, according to Proposition 6, in any D-sequent $(F_{earlier}, X', g) \rightarrow X"$, one can replace $F_{earlier}$ with $F_{current}$ where the latter is obtained from the former by adding some resolvent-clauses. Second, whenever DDS_impl derives a new D-sequent, X' is the set $X_{red}$ of all unassigned variables of $F_q$ already proved redundant. So when Applicants say that g→X" holds, Applicants mean that (F, X', g)→X" does where F is the current formula (i.e. the latest version of F) and X' is $X_{red}$.

SECTION 6. Description of DDS_impl 6.1 Search Tree

DDS_impl branches on variables of X of F(X,Y) building a search tree. The current path of the search tree is specified by partial assignment q. DDS_impl does not branch on variables proved redundant for current q. Backtracking to the root of the search tree means derivation of D-sequent Ø→X (here Applicants use the simplified notation of D-sequents, see Subsection 5.3). At this point, DDS_impl terminates. Applicants will denote the last variable assigned in q as Last (q).

Let x be a branching variable. DDS_impl maintains the notion of left and right branches corresponding to the first and second assignment to x respectively. (In the modern SAT-solvers, the second assignment to a branching variable x is implied by a clause C derived in the left branch of x where C is empty in the left branch. A QEP-solver usually deals with satisfiable formulas. If the left branch of x contains a satisfying assignment, clause C above does not exist.)

Although DDS_impl distinguishes between decision and implied assignments (and employs BCP procedure), no notion of decision levels is used. When an assignment (decision or implied) is made to a variable, the depth of the current path increases by one and a new node of the search tree is created at the new depth. The current version of DDS_impl maintains a single search tree (no restarts are used).

6.2 Leaf Condition, Active D-sequents, Branch Flipping

Every assignment made by DDS_impl is added to q. The formula DDS_impl operates on is $Dis(F_q, X_{red})$. When a monotone variable x appears in $Dis(F_q, X_{red})$, it is added to the set $X_{red}$ of redundant variables of $F_q$ and the {x}-clauses are removed from $Dis(F_q, X_{red})$. For every variable x' of $X_{red}$ there is one D-sequent g→{x'} where g⊆q. Applicants will call such a D-sequent active. (Partial assignment g is in general different for different variables of $X_{red}$.) Let $D_{seq}^{act}$ denote the current set of active D-sequents.

DDS_impl keeps adding assignments to q until every variable of F is either assigned (i.e. in Vars(q)) or redundant (i.e. in $X_{red}$). Applicants will refer to this situation as the leaf condition. The appearance of an empty clause in $Dis(F_q, X_{red})$ is one of the cases where the leaf condition holds.

If DDS_impl is in the left branch of x (where x=Last(q)) when the leaf condition occurs, DDS_impl starts the right branch by flipping the value of x. For every variable x' of $X_{red}$, DDS_impl checks if g of D-sequent g→{x'} contains an assignment to x. If it does, then this D-sequent is not true any more. Variable x' is removed from $X_{red}$ and g→{x'} is removed from $D_{seq}^{act}$ and added to the set $D_{seq}^{inact}$ of inactive D-sequents. Every {x'}-clause C discarded from $Dis(F_q, X_{red})$ due to redundancy of x' is recovered (unless C contains a variable that is still in $X_{red}$).

6.3 Merging Results of Left and Right Branches

If DDS_impl is in the right branch of x (where x=Last(q)) when the leaf condition occurs, then DDS_impl does the following. First DDS_impl unassigns x. Then DDS_impl examines the list of variables removed from $X_{red}$ after flipping the value of x. Let x' be such a variable and $S_{left}$ and $S_{right}$ be the D-sequents of x' that were active in the left and right branch respectively. (Currently $S_{left}$ is in $D_{seq}^{inact}$). If $S_{right}$ does not depend on x, then $S_{left}$ is just removed from $D_{seq}^{inact}$ and $S_{right}$ remains in the set of active D-sequents $D_{seq}^{act}$. Otherwise, $S_{left}$ is resolved with $S_{right}$ on x. Then $S_{left}$ and $S_{right}$ are removed from $D_{seq}^{inact}$ and $D_{seq}^{act}$ respectively, and the resolvent is added to $D_{seq}^{act}$ and becomes a new active D-sequent of x'.

Then DDS_impl makes variable x itself redundant. (At this point every variable of X but x is either assigned or redundant.) To this end, DDS_impl eliminates all {x}-removable boundary points from $Dis(F_q, X_{red})$ by adding some resolvents on variable x. This is done as follows. First, a CNF H is formed from $Dis(F_q, X_{red})$ by removing all the {x}-clauses and adding a set of "directing" clauses $H_{dir}$. The latter is satisfied by an assignment p if at least one clause C' of Dis $(F_q, X_{red})$ with literal x and one clause C" with literal $\bar{x}$ is falsified by p. (How $H_{dir}$ is built is described in [8].) The satisfiability of H is checked by calling a SAT-solver. If H is satisfied by an assignment p, then the latter is an {x}-removable boundary point of $Dis(F_q, X_{red})$. It is eliminated by adding a resolvent C on x to $Dis(F_q, X_{red})$. (Clause C is also added to H). Otherwise, the SAT-solver returns a proof Proof that H is unsatisfiable.

Finally, a D-sequent g→{x'} is generated satisfying the conditions of Proposition 8. To make g satisfy the second condition of Proposition 8, DDS_impl uses Proof above. Namely, every assignment falsifying a literal of a clause of $Dis(F_q, X_{red})$ used in Proof is included in g.

6.4 Pseudocode of DDS_impl

The main loop of DDS_impl is shown in Example 7.1. DDS_impl can be in one of the six states listed in Example 7.1. DDS_impl terminates when it reaches the state Finish. Otherwise, DDS_impl calls the procedure corresponding to the current state. This procedure performs some actions and returns the next state of DDS_impl.

DDS_impl starts in the BCP state in which it runs the BCP procedure (Example 7.3). Let C be a unit clause of $Dis(F_q, X_{red})$ where Vars(C)⊆X. As Applicants mentioned in Subsection 5.2, DDS_impl adds D-sequent g→X" to $D_{seq}^{act}$ where X"=X\(Vars(q)∪$X_{red}$) and g is the minimal assignment falsifying C. This D-sequent corresponds to the (left) branch of the search tree. In this branch, the only literal of C is falsified, which makes the leaf condition true.

If a conflict occurs during BCP, DDS_impl switches to the state Conflict and calls a procedure that generates a conflict clause $C_{cnfl}$ (Example 7.5). Then DDS_impl backtracks to the first node of the search tree at which $C_{cnfl}$ becomes unit.

If BCP does not lead to a conflict, DDS_impl switches to the state Decision_Making and calls a decision making procedure (Example 7.2). This procedure first looks for monotone variables. ($X_{mon}$ of Example 7.2 denotes the set of new monotone variables.) If after processing monotone variables every unassigned variable is redundant DDS_impl switches to the Backtracking state (and calls the Backtrack procedure, see Example 7.6). Otherwise, a new assignment is made and added to q.

If DDS_impl backtracks to the right branch of x (where x may be an implied or a decision variable), it switches to the state BPE (Boundary Point Elimination) and calls the BPE procedure (Example 7.4). This procedure merges results of left and right branches as described in Subsection 6.3.

6.5 Example

Example 3 Let $F(X,Y)$ consist of clauses: $C_1=x_1 \vee y_1$, $C_2=\bar{x}_1 \vee \bar{x}_2 \vee y_2$, $C_3=x_1 \vee x_2 \vee \bar{y}_3$. Let us consider how DDS_impl builds formula $F^*(Y)$ equivalent to $\exists X.F(X,Y)$. Originally, q, $X_{red}$, $D_{seq}^{act}$, $D_{seq}^{inact}$ are empty. Since F does not have a unit clause, DDS_impl switches to the state Decision_Making. Suppose DDS_impl picks $x_1$ for branching and first makes assignment $x_1=0$. At this point, $q=(x_1=0)$, clause $C_2$ is satisfied and $F_q=y_1 \wedge (x_2 \vee \bar{y}_3)$.

Before making next decision, DDS_impl processes the monotone variable $x_2$. First the D-sequent $g \rightarrow \{x_2\}$ is derived and added to $D_{seq}^{act}$ where $g=(x_1=0)$. (The appearance of the assignment $(x_1=0)$ in g is due to Proposition 8. According to Condition 8, g has to contain assignments that keep satisfied or redundant the $\{x_2\}$-clauses that are not currently in $F_q$. The only $\{x_2\}$-clause that is not in $F_q$ is $C_2$. It is satisfied by $(x_1=0)$.) Variable $x_2$ is added to $X_{red}$ and clause $x_2 \vee \bar{y}_3$ is removed from $F_q$ as containing redundant variable $x_2$. So $Dis(F_q, X_{red})=\{y_1\}$.

Since X has no variables to branch on (the leaf condition), DDS_impl backtracks to the last assignment $x_1=0$ and starts the right branch of $x_1$. So $q=(x_1=1)$. Since the D-sequent $(x_1=0) \rightarrow \{x_2\}$ is not valid now, it is moved from $D_{seq}^{act}$ to $D_{seq}^{inact}$. Since $x_2$ is not redundant anymore it is removed from $X_{red}$ and the clause $C_2$ is recovered in $F_q$ which is currently equal to $\bar{x}_2 \vee y_2$ (because $C_1$ and $C_3$ are satisfied by q).

Since $x_2$ is monotone again, D-sequent $(x_1=1) \rightarrow \{x_2\}$ is derived, $x_2$ is added to $X_{red}$ and $C_2$ is removed from $F_q$. So $Dis(F_q, X_{red})=\emptyset$. At this point DDS_impl backtracks to the right branch of $x_1$ and switches to the state BPE.

In the BPE state, $x_1$ is unassigned. $C_1$ satisfied by assignment $x_1=1$ is recovered. $C_2$ and $C_3$ (removed due to redundancy of $x_2$) are not recovered. The reason is that redundancy of $x_2$ has been proved in both branches of $x_1$. So $x_2$ stays redundant due to generation of D-sequent $\emptyset \rightarrow \{x_2\}$ obtained by resolving D-sequents $(x_1=0) \rightarrow \{x_2\}$ and $(x_1=1) \rightarrow \{x_2\}$ on $x_1$. So $Dis(F_q, X_{red})=\{C_1\}$. D-sequent $\emptyset \rightarrow \{x_2\}$ replaces $(x_1=1) \rightarrow \{x_2\}$ in $D_{seq}^{act}$. D-sequent $(x_1=0) \rightarrow \{x_2\}$ is removed from $D_{seq}^{inact}$.

Then DDS_impl is supposed to make $x_1$ redundant by adding resolvents on $x_1$ that eliminate $\{x_1\}$-removable boundary points of $Dis(F_q, X_{red})$. Since $x_1$ is monotone in $Dis(F_q, X_{red})$ it is already redundant. So D-sequent $\emptyset \rightarrow \{x_1\}$ is derived and $x_1$ is added to $X_{red}$. Since q is currently empty, DDS_impl terminates returning an empty set of clauses as a CNF formula $F^*(Y)$ equivalent to $\exists X.F(X,Y)$.

Proposition 9 DDS_impl is sound and complete.
SECTION 7. Compositionality of DDS_impl and Pseudocode Examples Let $F(X,Y)=F_1(X_1,Y_1) \wedge \ldots \wedge F_k(X_k,Y_k)$ where $(X_i \cup Y_i) \cap (X_j \cup Y_j)=\emptyset$, $i \neq j$. As Applicants mentioned in the introduction, the formula $F^*(Y)$ equivalent to $\exists X.F(X,Y)$ can be built as $F^*_1 \wedge \ldots \wedge F^*_k$ where $F^*_i(Y_i) \equiv \exists X_i.F_i(X_i,Y_i)$.

Applicants will say that a QEP-solver is compositional if it reduces the problem of finding $F^*$ to k independent subproblems of building $F^*_i$. The DP-procedure [5] is compositional (clauses of $F_i$ and $F_j$, $i \neq j$ cannot be resolved with each other). However, it may generate a huge number of redundant clauses. A QEP-solver based on enumeration of satisfying assignments is not compositional. (The number of blocking clauses, i.e. clauses eliminating satisfying assignments of F, is exponential in k). A QEP-solver based on BDDs [3] is compositional but only for variable orderings where variables of $F_i$ and $F_j$, $i \neq j$ do not interleave.

Proposition 10 DDS_impl is compositional regardless of how branching variables are chosen.

The fact that DDS_impl is compositional regardless of branching choices is important in practice. Suppose $F(X,Y)$ does not have independent subformulas but such subformulas appear in branches of the search tree. A BDD-based QEP-solver may not be able to handle this case because a BDD maintains one global variable order (and different branches may require different variable orders). DDS_impl does not have such a limitation. It will automatically use its compositionality whenever independent subformulas appear.

Example 7.1

Main loop of DDS_impl

// Given $F(X,Y)$, DDS_impl returns $F^*(Y)$
// such that $F^*(Y) \equiv \exists X.F(X,Y)$
// q is a partial assignment to vars of X
// States of DDS_impl are Finish, BCP, BPE,
// Decision_Making, Conflict, Backtracking DDS_impl
(F,X,Y) {while (True) if (state==Finish) return(Dis(F, X)); if (state==Non_Finish_State) {state=state_procedure (q, other_params); continue;}}

Example 7.2

Pseudocode of the Decision_making Procedure decision_making (q, F, X, $X_{red}$, $D_{seq}^{act}$)
$\{\{X_{mon}, D_{seq}^{act}(X_{mon})\} \leftarrow$ find_monot_vars(F,X);
$D_{seq}^{act}=D_{seq}^{act}(X_{red}) \cup D_{seq}^{act}(X_{mon})$;
$X_{red}=X_{red} \cup X_{mon}$;
if $(X==X_{red} \cup Vars(q))$ if $(Vars(q)==\emptyset)$ return(Finish); else return(Backtracking);
$F=Dis(F,X_{mon})$;
assgn(x)←pick_assgn(F,X);
q'=q∪assgn(x);
return(BCP);}

Example 7.3

Pseudocode of the bcp Procedure bcp(q,F,$C_{unsat}$)
{(answer,F,q,$C_{unsat}$,$D_{seq}^{act}$)←run_bcp(q,F);
if (answer==unsat_clause) return(Conflict);
else return(Decision_Making);}

Example 7.4

Pseudocode of the bpe Procedure bpe(q,F,$X_{red}$,$D_{seq}^{act}$,$D_{seq}^{inact}$)
{x=Last(q);
(q,F)←unassign(q,F,x);
(F,Proof)←elim_bnd_pnts(F,x);
optimize (Proof);
($D_{seq}^{act}$,$D_{seq}^{inact}$)←resolve($D_{seq}^{act}$,$D_{seq}^{inact}$,x);
$D_{seq}^{act}(\{x\})$=gen_Dsequent(q,Proof);
$D_{seq}^{act}=D_{seq}^{act}(X_{red}) \cup D_{seq}^{act}(\{x\})$;
$X_{red}=X_{red} \cup \{x\}$;
F=Dis(F,{x});
if (Var(q)==$\emptyset$) return(Finish);
else return(Backtracking);}

Example 7.5

Pseudocode of the cnfl_processing Procedure cnfl_processing (q,F,$C_{unsat}$)
{(q,F,$C_{cnfl}$)←gen_cnfl_clause (q,F,$C_{unsat}$);

$F = F \cup C_{cnfl}$;
if ($C_{cnfl} = \emptyset$) return(Finish);
x=Last(q);
if (left_branch(x)) return(BCP);
else return(BPE);}

Example .6

Pseudocode of the Backtrack Procedure backtrack $(q,F,X_{red},D_{seq}^{act},D_{seq}^{inact})$
{x=Last(q);
if (right_branch(x)) return(BPE); q=flip_assignment(q,x);
x'=find_affected_red_vars$(D_{seq}^{act}(X_{red})$, x);
$D_{seq}^{act} = D_{seq}^{act}(X_{red}) \setminus D_{seq}^{act}(X')$; $D_{seq}^{inact} = D_{seq}^{inact}(X_{red}) \cup D_{seq}^{act}(X')$; $X_{red} = X_{red} \setminus X'$; F=recover_clauses (F,X');
return(BCP);}

SECTION 8. Experimental Results

TABLE 1

Results for the sum-of-counters experiment (wherein instances marked with '*' exceeded the time limit of 2 hours).

| #bits | #counters | #state vars | Enum-SA (s.) | Inter-pol. Pico. (s.) | Inter-pol. Mini. (s.) | DDS_impl rand. (s.) | DDS_impl (s.) |
|---|---|---|---|---|---|---|---|
| 3 | 5 | 15 | 12.1 | 0.0 | 0.0 | 0.0 | 0.0 |
| 4 | 20 | 80 | * | 0.4 | 0.1 | 0.5 | 0.4 |
| 5 | 40 | 200 | * | 42 | 26 | 7 | 5 |
| 6 | 80 | 480 | * | * | * | 101 | 67 |

TABLE 2

Experiments with model checking formulas
(wherein the time limit is one minute)

| model | DP | | EnumSA | | DDS_impl | |
|---|---|---|---|---|---|---|
| checking mode | solved (%) | time (s.) | solved (%) | time (s.) | solved (%) | time (s.) |
| forward | 416 (54%) | 664 | 425 (56%) | 466 | 531 (70%) | 3,143 |
| backward | 47 (6%) | 13 | 97 (12%) | 143 | 559 (73%) | 690 |

In this section, Applicants give results of some experiments with an implementation of our method called DDS_impl. The objectives of the experiments are a) to emphasize the compositionality of DDS_impl; b) to compare DDS_impl with a QEP-solver based on enumeration of satisfying assignments. As a such QEP-solver Applicants used an implementation of the algorithm recently introduced at CAV-11 [2] (courtesy of Andy King). (Applicants will refer to this QEP-solver as EnumSA). For the sake of completeness, Applicants also compared DDS_impl and EnumSA with our implementation of the DP procedure.

Our current implementation is not particularly well optimized yet and written just to satisfy the two objectives above. For example, to simplify the code, the SAT-solver employed to find boundary points does not use fast BCP (watched literals). More importantly, the current version of DDS_impl lacks important features that should have a dramatic impact on its performance. For example, to simplify memory management, DDS_impl does not currently reuse D-sequents. As soon as two D-sequents are resolved (to produce a new D-sequent) they are discarded.

To verify the correctness of results of DDS_impl Applicants used two approaches. If an instance $\exists X.F(X,Y)$ was solved by EnumSA, Applicants simply checked the CNF formulas F*(Y) produced by DDS_impl and EnumSA for equivalence. Otherwise, Applicants applied a two-step procedure. First, Applicants checked that every clause of F* was implied by F. Second, Applicants did random testing to see if F* missed some clauses. Namely, Applicants randomly generated assignments y satisfying F*. For every y Applicants checked if it could be extended to (x,y) satisfying F. (If no such extension exists, then F* is incorrect.)

In the first experiment (Table 1), Applicants considered a circuit N of k independent m-bit counters. Each counter had an independent input variable. The property Applicants checked (further referred to as φ) was $Num(Cnt_1) + \ldots + Num(Cnt_k) < R$. Here $Num(Cnt_i)$ is the number specified by the outputs of i-th counter and R is a constant equal to $k*(2^m-1)+1$. Since, the maximum number that appears at the outputs of a counter is $2^m-1$, property φ holds. Since the counters are independent of each other, the state space of N is the Cartesian product of the k state spaces of individual counters. However, property φ itself is not compositional (one cannot verify it by solving k-independent subproblems), which makes verification harder.

The first two columns of Table 1 give the value of m and k of four circuits N. The third column specifies the number of state variables (equal to m*k). In this experiment, Applicants applied EnumSA and DDS_impl to verify property φ using forward model checking. In either case, the QEP-solver was used to compute CNF formula $RS^*(s_{next})$ specifying the next set of reachable states. It was obtained from formula $\exists S_{curr} \exists X.Tr(S_{curr}, S_{next}, X) \land RS_p(S_{curr})$ by quantifier elimination. Here Tr is a CNF formula representing the transition relation and $RS_p(S_{curr})$ specifies the set of states reached in p iterations. $RS_{p+1}(S_{curr})$ was computed as a CNF formula equivalent to $RS_p(S_{curr}) \lor RS^*(S_{curr})$.

Applicants also estimated the complexity of verifying the examples of Table 1 by interpolation [12]. Namely, Applicants used Picosat 913 and Minisat 2.0 for finding a proof that φ holds for $2^{m-1}$ iterations (the diameter of circuits N of Table 1 is $2^m$, m=3,4,5,6). Such a proof is used in the method of [12] to extract an interpolant. So, in Table 1, Applicants give only the time necessary to find the first interpolant.

Table 1 shows that EnumSA does not scale well (the number of blocking clauses one has to generate for the formulas of Table 1 is exponential in the number of counters). Computation of interpolants scales much better, but Picosat and Minisat failed to compute a proof for the largest example in 2 hours.

The last two columns of Table 1 give the performance of DDS_impl when branching variables were chosen randomly (next to last column) and heuristically (last column). In either case, DDS_impl shows good scalability explained by the fact that DDS_impl is compositional. Moreover, the fact that the choice of branching variables is not particularly important means that DDS_impl has a "stronger" compositionality than BDD-based QEP-solvers. The latter are compositional only for particular variable orderings.

In second and third experiments (Table 2) Applicants used the 758 model checking benchmarks of HWMCC'10 competition [15]. In the second experiment, (the first line of Table 2) Applicants used DP, EnumSA and DDS_impl to compute the set of states reachable in the first transition. In this case one needs to find CNF formula F*(Y) equivalent to $\exists X.F(X,Y)$ where F(X,Y) specifies the transition relation and the initial state. Then F*(Y) gives the set of states reachable in one transition.

In the third experiment, (the second line of Table 2) Applicants used the same benchmarks to compute the set of bad states in backward model checking. In this case, formula F(X,Y) specifies the output function and the property (where Y is the set of variables describing the current state). If F(X,Y) evaluates to 1 for some assignment (x,y) to X∪Y, the property is broken and the state specified by y is "bad". The formula F*(Y) equivalent to ∃X.F(X,Y) specifies the set of bad states.

Table 2 shows the number of benchmarks solved by each program and the percentage of this number to 758. Besides the time taken by each program for the solved benchmarks is shown. DDS_impl solved more benchmarks than EnumSA and DP in forward model checking and dramatically more benchmarks in the backward model checking. DDS_impl needed more time than DP and EnumSA because typically the benchmarks solved only by DDS_impl were the most time consuming.

SECTION 9. Background

The notion of boundary points was introduced in [9] for pruning the search tree (in the context of SAT-solving). The relation between a resolution proof and the process of elimination of boundary points was discussed in [10, 8]. The previous applications considered only the notion of $\{z\}$-boundary of formula G(Z) where z is a variable of Z. In the present application, Applicants consider Z'-boundary points where Z' is an arbitrary subset of Z. (This extension is not trivial and at the same time crucial for the introduction of D-sequents.)

The idea of a QEP-solver based on enumerating satisfying assignments was introduced in [13]. It has been further developed in [11, 7, 2]. In [12] it was shown how one can avoid QEP-solving in reachability analysis by building interpolants. Although, this direction is very promising, interpolation based methods have to overcome the following problem. In the current implementations, interpolants are extracted from resolution proofs. Unfortunately, modern SAT-solvers are still not good enough to take into account the high-level structure of a formula. (An example of that is given in Section 8.) So proofs they find and the interpolants extracted from those proofs may have poor quality.

Note that our notion of redundancy of variables is different from observability related notions of redundancy. For instance, in contrast to the notion of careset [6], if a CNF formula G(Z) is satisfiable, all the variables of Z are redundant in the formula ∃Z.G(Z) according to our definition. (G may have a lot of boundary points, but none of them is removable. So ∃Z.G(Z) is equivalent to an empty CNF formula. Of course, to prove the variables of Z redundant, one has to derive D-sequent ∅→Z.)

SECTION 10. Conclusion

Applicants present a new method for eliminating existential quantifiers from a Boolean CNF formula ∃X.F(X,Y). The essence of this method is to add resolvent clauses to F and record the decreasing dependency on variables of X by dependency sequents (D-sequents). An algorithm based on this method (called DDS, Derivation of D-Sequents) terminates when it derives the D-sequent saying that the variables of X are redundant. Using this termination condition may lead to a significant performance improvement in comparison to the algorithms based on enumerating satisfying assignments. This improvement may be even exponential (e.g. if a CNF formula is composed of independent subformulas.)

Our preliminary experiments with a very simple implementation show the promise of DDS. At the same time, DDS needs further study. Here are some directions for future research: a) decision making heuristics; b) reusing D-sequents; c) efficient data structures; d) getting information about the structure of the formula (specified as a sequence of D-sequents to derive).

SECTION 11. Proofs 11.1 Proofs of Section 2

Proposition 1 Point p is a Z'-removable boundary point of a CNF formula G(Z) if no point p* obtained from p by changing values of (some) variables of Z' satisfies G.

Proof: If part. Let us partition G into $G_1$ and $G_2$ where $G_1$ is the set of Z'-clauses and $G_2$ is the set of of non-Z'-clauses. By definition, p is a Z"-boundary point where $Z'' \subseteq Z'$. So p satisfies $G_2$.

Let C be the clause such that

Vars(C)=Z\Z',

C is falsified by p.

Clause C is implied by $G_1$. Indeed, assume the contrary i.e. there exists p* for which $G_1(p^*)=1$ and C (p*)=0. Note that since p* falsifies C, it can be different from p only in assignments to Z\Z'. Then, there is a point p* obtained by flipping values of Z' that satisfies $G_1$. But since p* has the same assignments to variables of Z\Z' as p, it satisfies $G_2$ too. So p* is obtained by flipping assignments of Z' and satisfies G, which contradicts the assumption of the proposition at hand. So C is implied by $G_1$. Since C satisfies the conditions of Definition 5, p is a Z'-removable boundary point.

Only if part. Assume the contrary. That is there is clause C satisfying the conditions of Definition 5 and there is a point p* obtained from p by flipping values of variables of Z' that satisfies G. Then p* also satisfies the set $G_1$ of Z'-clauses of G. Since C is implied by $G_1$, then C is satisfied by p* too. Since p and p* have identical assignments to the variables of Z\Z', then C is also satisfied by p. However this contradicts one of the conditions of Definition 5 assumed to be true.

11.2 Proofs of Section 3

Lemma 1 Let p' be a $\{z\}$-boundary point of CNF formula G(Z) where z∈Z. Let p" be obtained from p' by flipping the value of z. Then p" either satisfies F or it is also a $\{z\}$-boundary point.

Proof: Assume the contrary i.e. p" falsifies a clause C of G that does not have a variable of z. (And so p" is neither a satisfying assignment nor a $\{z\}$-boundary point of G.) Since p' is different from p" only in the value of z, it also falsifies C. Then p' is not a $\{z\}$-boundary point of G. Contradiction.

Proposition 2 Let G(Z) be a CNF formula and z be a monotone variable of F. (That is clauses of G contain the literal of z of only one polarity.) Then z is redundant in G.

Proof: Let us consider the following two cases.

G(Z) does not have a $\{z\}$-boundary point. Then the proposition holds.

G(Z) has a $\{z\}$-boundary point p'. Note that the clauses of G falsified by p' have the same literal l(z) of variable z. Let p" be the point obtained from p' by flipping the value of z. According to Lemma 1, one needs to consider only the following two cases.

p" satisfies G. Then p' is not a $\{z\}$-removable boundary point. This implies that p' is not a removable boundary point of G either (see Remark 1). So the proposition holds.

p" falsifies only the clauses of G with literal $\overline{l(z)}$. (Point p" cannot falsify a clause with literal l(z).) Then G has literals of z of both polarities and z is not a monotone variable. Contradiction.

Proposition 3 Let F(X,Y) be a CNF formula and X' be a subset of X. Then ∃X.F(X,Y)≡∃(X\X'). Dis(F, X') if the variables of X' are redundant in F.

Proof: Denote by X" the set X\X' and by F*(X",Y) the formula Dis(F, X').

If part. Assume the contrary i.e. the variables of X' are redundant but $\exists X.F(X,Y) \neq \exists X''.F^*(X'',Y)$. Let y be an assignment to Y such that $\exists.F(X,y) \neq \exists X''.F^*(X'',y)$. One has to consider the following two cases.

- $\exists X.F(X,y)=1$, $\exists X''.F^*(X'',y)=0$. Then there exists an assignment x to X such that (x,y) satisfies F. Since every clause of $F^*$ is in F, formula $F^*$ is also satisfied by (x'',y) where x'' consists of the assignments of x to variables of X''. Contradiction.
- $\exists X.F(X,y)=0$, $\exists X''.F^*(X'',y)=1$. Then there exists an assignment x'' to variables of X'' such that (x'',y) satisfies $F^*$. Let x be an assignment to X obtained from x'' by arbitrarily assigning variables of X'. Since $F(X,y)=0$, point (x,y) falsifies F. Since $F^*(x,y)=1$ and every clause of F that is not $F^*$ is an X'-clause, (x,y) is an X'*-boundary point of F. Since $F(X,y)=0$, (x,y) is removable. Hence the variables of X' are not redundant in F. Contradiction.

Only if part. Assume the contrary i.e. $\exists X.F(X,Y)=\exists X''.F^*(X'',Y)$ but the variables of X' are not redundant in F. Then there is an X'* boundary point p=(x,y) of F where $X'^* \subset X'$ that is removable in F. Since p is a boundary point, $F(\overline{p})=0$. Since p is removable, $\exists X.F(X, y)=0$. On the other hand, since p falsifies only X'-clauses of F, it satisfies $F^*$. Then the point (x'',y) obtained from p by dropping the assignments to X' satisfies $F^*$. Hence $\exists X''.F^*(X'',y)=1$ and so $\exists X.F(X,y) \neq \exists X''.F^*(X'', y)$. Contradiction.

11-3. Proofs of Section 4

Definition 14 Point p is called a Z'-unremovable boundary point of G(Z) where $Z' \subset Z$ if p is a Z''-boundary point where $Z'' \subset Z'$ and clause C of Definition 5 does not exist. (According to Proposition 1 this means that by flipping values of variables of Z' in p one can get a point satisfying G.)

Definition 15 Let G(Z) be a CNF formula and p be an Z'-boundary point of G where $Z' \subset Z$. A point $p^*$ is called a Z''-neighbor of p if $Z' \subset Z''$ p and $p^*$ are different only in (some) variables of Z''. In other words, p and $p^*$ can be obtained from each other by flipping (some) variables of Z''.

Proposition 4 Let G(Z) be a CNF formula. Let G have no $\{z\}$-removable boundary points. Let C be a clause. Then the formula $G \wedge C$ does not have a $\{z\}$-removable boundary point if at least one of the following conditions hold: a) C is implied by G; b) $z \notin Vars(C)$.

Proof: Let p be a complete assignment to the variables of G (a point) and C be a clause satisfying at least one of the two conditions of the proposition. Assume the contrary i.e. that p is a $\{z\}$-removable boundary point of $G \wedge C$.

Let us consider the following four cases.

CASE 1. G(p)=0, C (p)=0.
Suppose that p is not a $\{z\}$-boundary point of G. Then it falsifies a clause C' of G that is not a $\{z\}$-clause. Then p is not a $\{z\}$-boundary point of $G \wedge C$. Contradiction.
Suppose that p is a $\{z\}$-unremovable boundary point of G. (According to the conditions of the proposition at hand, G cannot have a $\{z\}$-removable boundary point.) This means that the point p' that is the $\{z\}$-neighbor of p satisfies G.
Assume that C is not a $\{z\}$-clause. Then p is not a $\{z\}$-boundary point of $G \wedge C$. Contradiction.
Assume that C is implied by G. Then C (p')=1 and so p' satisfies $G \wedge C$. Then p is still a $\{z\}$-unremovable boundary point of $G \wedge C$. Contradiction.

CASE 2. G (p)=0, C (p)=1.
Suppose that p is not a $\{z\}$-boundary point of G. Then it falsifies a clause C' of G that is not a $\{z\}$-clause. Then p is not a $\{z\}$-boundary point of $G \wedge C$. Contradiction.
Suppose that p is a $\{z\}$-unremovable boundary point of G. This means that the point p' that is the $\{z\}$-neighbor of p satisfies G.
Assume that C is not a $\{z\}$-clause. Then C(p)=C(p') and so C(p')=1. Then p' satisfies $G \wedge C$ and so p is a $\{z\}$-unremovable boundary point of $G \wedge C$. Contradiction.
Assume that C is implied by G and so C(p')=1. Hence p' satisfies $G \wedge C$. Then p is a $\{z\}$-unremovable boundary point of $G \wedge C$. Contradiction.

CASE 3. G(p)=1, C(p)=0.
If C is implied by G, then Applicants immediately get a contradiction.
If C is not a $\{z\}$-clause, then p falsifies a non-$\{z\}$-clause of $G \wedge C$ and so p is not a $\{z\}$-boundary point of $G \wedge C$. Contradiction.

CASE 4. G(p)=1, C(p)=1. Point p satisfies $G \wedge C$ and so cannot be a $\{z\}$-boundary point of $G \wedge C$. Contradiction.

Proposition 5 Let G(Z) be a CNF formula. Let G have no $\{z\}$-removable boundary points. Let C be a $\{z\}$-clause of G. Then the formula $G'=G \setminus \{C\}$ does not have a $\{z\}$-removable boundary point.

Proof: Let p be a complete assignment to the variables of G (a point). Assume the contrary i.e. that $z \in Vars(C)$ and p is a $\{z\}$-removable boundary point of G'. Let us consider the following three cases.

CASE 1. G(p)=0, C(p)=0.
Suppose that p is not a $\{z\}$-boundary point of G. Then there is clause C' of G that is not a $\{z\}$-clause and that is falsified by p. Since C' is different from C (because the former is not a $\{z\}$-clause) it remains in G'. Hence p is not a $\{z\}$-boundary point of G'. Contradiction.
Suppose that p is a $\{z\}$-unremovable boundary point of G. Then its $\{z\}$-neighbor p' satisfies G and hence G'. Then p either satisfies G' (if C is the only $\{z\}$-clause of G falsified by p) or p is a $\{z\}$-unremovable boundary point of G'. In either case, Applicants have a contradiction.

CASE 2. G(p)=0, C(p)=1.
Suppose that p is not a $\{z\}$-boundary point of G. Using the same reasoning as above Applicants get a contradiction.
Suppose that p is a $\{z\}$-unremovable boundary point of G. Then its $\{z\}$-neighbor p' satisfies G and hence G'. Let C' be a $\{z\}$-clause of G falsified by p. Since C' is different from C (the latter being satisfied by p), it is present in G'. Hence p falsifies G'. Then p is a $\{z\}$-unremovable boundary point of G'. Applicants have a contradiction.

CASE 3. G(p)=1. Then G'(p)=1 too and so p cannot be a boundary point of G'. Contradiction.

11.4 Proofs of Section 5

SUBSECTION 11.4.1: Formula Replacement in a D-sequent

Proposition 6 Let $F^+(X,Y)$ be a CNF formula obtained from F(X,Y) by adding some resolvents of clauses of F. Let q be a partial assignment to variables of X and $X'^* \subset X'$. Then the fact that D-sequent (F, X', q)$\to$X'' holds implies that holds too. The opposite is $(F^+, X', q) \to X''$ not true.

Proof: First, let us prove that if (F, X', q)$\to$X'' holds, $(F^+, X', q) \to X''$ holds too. Let us assume the contrary, i.e. holds (F, X', q)$\to$X'' but $(F^+, X', q) \to X''$ does not. According to Definition 10, this means that either:

variables of X' are not redundant in $F_q^+$ or
variables of X'' are not redundant in $Dis(F_q^+, X')$.

CASE A: The fact that the variables of X' are not redundant in $F_q^+$ means that there is a removable X'*-boundary point p of $F_q^+$ where $X'^* \subseteq X'$. The fact that the variables of X' are redundant in $F_q$ means that p is not a removable $X'^*$-boundary point of $F_q$. Let us consider the three reasons for that.

- p satisfies $F_q$. Then it also satisfies $F_q^+$ and hence cannot be a boundary point of $F_q^+$. Contradiction.
- p is not an $X'^*$-boundary point of $F_q$. That is p falsifies a non-$X'$-clause C of $F_q$. Since $F_q^+$ also contains C, point p cannot be an $X'^*$-boundary point of $F_q^+$ either. Contradiction.
- p is an $X'^*$-boundary point of $F_q$ but it is not removable. This means that one can obtain a point p* satisfying $F_q$ by flipping the values of variables of X\Vars(q) in p. Since p* also satisfies $F_q^+$, one has to conclude that p is not a removable point of $F_q^+$. Contradiction.

CASE B: The fact that the variables of X" are not redundant in $Dis(F_q^+, X')$ means that there is a removable $X'''^*$-boundary point p of $Dis(F_q^+, X')$ where $X'''^* \subseteq X''$. The fact that the variables of X" are redundant in $Dis(\overline{F_q}, X')$ means that p is not a removable $X'''^*$-boundary point of $Dis(F_q, X')$.

Here one can reproduce the reasoning of case A). That is one can consider the three cases above describing why p is not an removable $X'''^*$-boundary point of $Dis(F_q, X')$ and show that each case leads to a contradiction for the same reason as above.

Now Applicants show that if $(F^+, X', q) \rightarrow X''$ holds this does not mean that $(F, X', q) \rightarrow X''$ holds too. Let $F(X,Y)$ be a CNF formula where $X=\{x\}, Y=\{y\}$. Let F consist of clauses $C_1, C_2$ where $C_1 = xvy$ and $C_2 = \overline{x}vy$. Let $F^+$ be obtained from F by adding the unit clause y (that is the resolvent of $C_1$ and $C_2$). It is not hard to see that the D-sequent $(F^+, \emptyset, \emptyset) \rightarrow \{x\}$ holds. (The latter does not have any $\{x\}$-boundary points. Hence it cannot have a removable $\{x\}$-boundary point.) At the same time, F has a removable $\{x\}$-boundary point p=(x=0, y=0). So the D-sequent $(F, \emptyset, \emptyset) \rightarrow \{x\}$ does not hold.

SUBSECTION 11.4.2: Resolution of D-sequents

Definition 16 Let $F(X,Y)$ be a CNF formula and $X' \subseteq X$. Applicants will say that the variables of X' are locally redundant in F if every X"-boundary point p of F where $X'' \subseteq X'$ is X'-removable.

Remark 5 Applicants will call the variables of a set X' globally redundant in $F(X,Y)$ if they are redundant in the sense of Definition 7. The difference between locally and globally redundant variables is as follows. When testing if variables of X' are redundant, in either case one checks if every X"-boundary point p of F where $X'' \subseteq X'$ is removable. The difference is in the set variables one is allowed to change. In the case of locally redundant variables (respectively globally redundant variables) one checks if p is X'-removable (respectively X-removable). In other words, in the case of globally variables one is allowed to change variables that are not in X'.

Lemma 2 If variables of X' are locally redundant in a CNF formula $F(X,Y)$ they are also globally redundant there. The opposite is not true.

Proof: See Remark 5.

Lemma 3 Let z be a monotone variable of $G(Z)$. Then variable z is locally redundant.

Proof: Let us assume for the sake of clarity that only positive literals of z occur in clauses of G. Let us consider the following two cases:

- Let G have no any $\{z\}$-boundary points. Then the proposition is vacuously true.
- Let p be a $\{z\}$-boundary point. By flipping the value of z from 0 to 1, Applicants obtain an assignment satisfying G. So p is not a removable $\{z\}$-boundary point and to prove that is sufficient to flip the value of z. Hence z is locally redundant in G.

Lemma 4 Let $F(X,Y)$ be a CNF formula and X' be a subset of variables of X that are globally redundant in F. Let X" be a non-empty subset of X'. Then the variables of X" are also globally redundant in F.

Proof: Assume the contrary, i.e. the variables of X" are not globally redundant in F. Then there is an $X'''^*$-boundary point p where $X'''^* \subseteq X''$ that is X-removable. Since $X'''^*$ is also a subset of X', the existence of point p means that the variables of X' are not globally redundant in F. Contradiction.

Remark 6 Note that Lemma 4 is not true for locally redundant variables. Let $F(X,Y)$ be a CNF formula and X' be a subset of variables of X that are locally redundant in F. Let X" be a non-empty subset of X'. Then one cannot claim that the variables of X" are locally redundant in F. (However it is true that they are globally redundant in F.)

For the rest of these proofs, Applicants will use only the notion of globally redundant variables (introduced by Definition 7).

Definition 17 Let X be a set of Boolean variables. Let C be a clause where $Vars(C) \subseteq X$. Let Vars(q) be a partial assignment to variables of X. Denote by $C_q$ the clause that is:
- equal to 1 (a tautologous clause) if C is satisfied by q;
- obtained from C by removing the literals falsified by q, if C is not satisfied by q.

Definition 18 Let $F(X,Y)$ be a CNF formula and q be a partial assignment to variables of X. Let X' and X" be subsets of X. Applicants will say that the variables of X" are locally irredundant in $Dis(F_q, X')$ if every $X'''^*$-boundary point of $Dis(F_q, X')$ where $X'''^* \subseteq X''$ that is (X\Vars(q))-removable in $Dis(F_q, X')$ is X-unremovable in F. Applicants will say that the variables of X" are redundant in $Dis(F_q, X')$ modulo local irredundancy.

Remark 7 The fact that variables of X" are locally irredundant in $Dis(F_q, X')$ means that the latter has an $X'''^*$-boundary point p where $X'''^* \subseteq X''$ that cannot be turned into a satisfying assignment in the subspace specified by q (because the values of variables of Vars(q) cannot be changed). However, p can be transformed into a satisfying assignment if variables of Vars(q) are allowed to be changed. This means that p can be eliminated only by an X-clause (implied by F) but cannot be eliminated by a clause depending only on variables of Y. Points like p can be ignored.

Lemma 5 Let $F(X,Y)$ be a CNF formula. Let $q_1$ and $q_2$ be partial assignments to variables of X that are resolvable on variable x. Denote by q the partial assignment $Res(q_1, q_2, x)$ (see Definition 11). Let $X_1$ (respectively $X_2$) be the subsets of variables of X already proved redundant in $F_{q_1}$ (respectively $F_{q_2}$). Let the set of variables X* where $X^* = X_1 \cap X_2$ be non-empty. Then the variables of X* are redundant in $F_q$ modulo local irredundancy.

Proof: Assume that the variables of X* are not redundant in $F_q$ and then show that this irredundancy is local. According to Definition 7, irredundancy of X* means that there is an $X'^*$-boundary point p where $X'^* \subseteq X^*$ that is (X\Vars(q))-removable in $F_q$. Since p is an extension of q, it is also an extension of $q_1$ or $q_2$. Assume for the sake of clarity that p is an extension of $q_1$.

The set of clauses falsified by p in $F_q$ and $F_{q_1}$ is specified by the set of clauses of F falsified by p. If a clause C of F is satisfied by p, then clause $C_q$ (see Definition 17) is either
- not in $F_q$ (because is C satisfied by q) or
- in $F_q$ and is satisfied by p.

The same applies to the relation between clause $C_{q_1}$ and CNF formula $F_{q_1}$. Let C be a clause falsified by p. Then C cannot be satisfied by q and so the clause $C_q$ is in $F_q$ The same applies to $C_{q_1}$ and $F_{q_1}$.

Since p falsifies the same clauses of F in $F_{q_1}$ and $F_q$, it is an $X'^*$-boundary point of $F_{q_1}$. Let P be the set of $2^{|X \setminus Vars(q_1)|}$ points obtained from p by changing assignments to variables of $X \setminus Vars(g_1)$. Since the variables of $X^*$ are redundant in $F_{q_1}$, then P has to contain a point satisfying $F_{q_1}$. This means that point p of $F_q$ can be turned into an assignment satisfying F if the variables that are in $Vars(q) \setminus Vars(q_1)$ are allowed to change their values. So the irredundancy of $X^*$ in $F_q$ can be only local.

Remark 8 In Definition 10 of D-sequent(F, X', q)→X", Applicants did not mention local irredundancy. However, in the rest of this section Applicants assume that the variables of X' in $F_q$ and those of X" in $Dis(F_q, X')$ may have local irredundancy. For the sake of simplicity, Applicants do not mention this fact with the exception of Lemmas 7 and 8. In particular, in Lemma 8, Applicants show that D-sequents derived by DDS_impl can only have local irredundancy and so the latter can be safely ignored.

Remark 9 Checking if a set of variables X', where $X \setminus Vars(q)$ is irredundant in $F_q$ only locally is hard. For that reason DDS_impl does not perform such a check. However, one has to introduce the notion of local irredundancy because the latter may appear when resolving D-sequents (see Lemma 5). Fortunately, given a D-sequent (F, X', q)→X", one does not need to check if irredundancy of variables X' in $F_q$ or X" in $Dis(F_q, X')$ (if any) is local. According to Lemma 8, this irredundancy is always local. Eventually a D-sequent (F,∅, ∅)→X is derived that does not have any local irredundancy (because the partial assignment q of this D-sequent is empty).

Lemma 6 Let F(X,Y) be a CNF formula and q be a partial assignment to variables of X. Let $X^*$ where $X^* \subseteq X$ be a set of variables redundant in $F_q$. Let sets X' and X" form a partition of $X^*$ i.e. $X^* = X' \cup X"$ and $X' \cap X" = \emptyset$. Then D-sequent (F, X', q)→X" holds.

Proof: Assume the contrary i.e. that the D-sequent (F, X', q)→X" does not hold. According to Definition 10, this means that either:
  variables of X' are not redundant in $F_q$ or
  variables of X" are not redundant in $Dis(F_q, X')$.

CASE A: This means that there exists an $X'^+$-boundary point p (where $X'^+ \subseteq X'$ and q≤p) that is removable in $F_q$. This implies that the variables of $X'^+$ are not a set of redundant variables. On the other hand, since $X'^+ \subseteq X'$ and the variables of X' are redundant, the variables of $\overline{X'^+}$ are redundant too. Contradiction.

CASE B: This means that there exists an $X"^+$-boundary point p (where $X"^+ \subseteq X"$ and q≤p) that is removable in $Dis(F_q, X')$. Note that point p is an $X^{*30}$-boundary point of $F_q$ where $X^{*+} \subseteq X^*$ (because $F_q$ consists of the clauses of $Dis(F_q, X')$ plus some X'-clauses). Since the variables of $X^*$ are redundant in $F_q$ the point p cannot be removable. Then there is a point p* obtained by flipping the variables of $X \setminus Vars(q)$ that satisfies $F_q$. Point p* also satisfies $Dis(F_q, X')$. Hence, the point p cannot be removable in $Dis(F_q, X')$. Contradiction.

Lemma 7 Let F(X,Y) be a CNF formula and q be a partial assignment to variables of X. Let D-sequent (F, X', q)→X" hold modulo local irredundancy. That is the variables of X' and X" are redundant in $F_q$ and $Dis(F_q, X')$ respectively modulo local irredundancy. Then the variables of $X' \cup X"$ are redundant in $F_q$ modulo local irredundancy.

Proof: Denote by $X^*$ the set $X' \cup X"$. Let p be a removable $X^+$-boundary point of $F_q$ where $X^+ \subseteq X^*$. Let us consider the two possible cases:
  $X^+ \subseteq X'$ (and so $X^+ \cap X" = \emptyset$). Since p is removable, the variables of X' are irredundant in $F_q$. Since this irredundancy can only be local one can turn p into an assignment satisfying F. This means that the irredundancy of variables $X^*$ in F due to point p is local.
  $X^+ \not\subseteq X'$ (and so $X^+ \cap X" \neq \emptyset$). Then p is an $X"^+$-boundary point of $Dis(F_q, X')$ where $X"^+ = X^+ \cap X"$. Indeed, for every variable x of $X^+$ there has to be a clause C of $F_q$ falsified by p such that $Vars(C) \cap X^+ = \{x\}$. Otherwise, x can be removed from $X^+$, which contradicts the assumption that p is an $X^+$-boundary point. This means that for every variable x of $X"^+$ there is a clause C falsified by p such that $Vars(C) \cap X"^+ = \{x\}$.

Let P denote the set of all $2^{|X \setminus (Vars(q) \cup X')|}$ points obtained from p by flipping values of variables of $X \setminus (Vars(q) \cup X')$. Let us consider the following two possibilities.
  Every point of P falsifies $Dis(F_q, X')$. This means that the point p is a removable $X"^+$-boundary point of $Dis(F_q, X')$. Hence the variables of X" are irredundant in $Dis(F_q, X')$. Since this irredundancy is local, point p can be turned into an assignment satisfying F by changing values of variables of X. Hence the irredundancy of $X^*$ in F due to point p is local.
  A point d of P satisfies $Dis(F_q, X')$. Let us consider the following two cases.
    * d satisfies $F_q$. This contradicts the fact that p is a removable $X^+$-boundary point of $F_q$. (By flipping variables of $X \setminus Vars(q)$ one can obtain a point satisfying $F_q$.)
    * d falsifies some clauses of $F_q$. Since $F_q$ and $Dis(F_q, X')$ are different only in X'-clauses, d is an $X'^*$-boundary point of $F_q$ where $X'^* \subseteq X'$. Since p is a removable $X^+$-boundary point of $F_q$, d is a removable $X'^*$-boundary point of $F_q$. So the variables of X' are irredundant in $F_q$. Since this irredundancy is local, the point d can be turned into an assignment satisfying F by changing the values of X. Then, the same is true for point p. So the irredundancy of $x^*$ in F due to point p is local.

Proposition 7 Let F(X,Y) be a CNF formula. Let D-sequents $S_1$ and $S_2$ be equal to (F, $X_1$, $q_1$)→X' and (F, $X_2$, $q_2$)→X' respectively. Let $q_1$ and $q_2$ be resolvable on variable x. Denote by q the partial assignment $Res(q_1, q_2, x)$ and by $X^*$ the set $X_1 \cap X_2$. Then, if $S_1$ and $S_2$ hold, the D-sequent S equal to (F, $X^*$, q)→X' holds too.

Proof: Lemma 7 implies that the variables of $X_1 \cup X'$ are redundant in $F_{q_1}$ and $F_{q_2}$ respectively. From Lemma 5, one concludes that the variables of the set $X" = (X_1 \cup X') \cap (X_2 \cup X')$ are redundant in $F_q$. From Definition 10 it follows that $X_1 \cap X' = X_2 \cap X' = \emptyset$. So $X" = X^* \cup X'$ where $X^* \cap X' = \emptyset$. Then, from Lemma 6, it follows that the D-sequent (F, $X^*$, q)→X' holds.

SUBSECTION 11.4.3: Derivation of a D-sequent

Proposition 8 Let F(X,Y) be a CNF formula and q be a partial assignment to variables of X. Let $X_{red}$ be the variables proved redundant in $F_q$. Let x be the only variable of X that is not in $Vars(q) \cup X_{red}$. Let D-sequent (F, $X_{red}$, q)→{x} hold. Then D-sequent (F, $X'_{red}$, g)→{x} holds where g and $X'_{red}$ are defined as follows. Partial assignment g to variables of X satisfies the two conditions below (implying that g≤q):

1. Let C be a {x}-clause of F that is not in $Dis(F_q, X_{red})$. Then either
   g contains an assignment satisfying C or
   D-sequent (F, $X^*_{red}$, g*)→{x*} holds where g*≤g, $X^*_{red} \subseteq X_{red}$ $x^* \in X_{red} \cap Vars(C)$ 2. Let $p_1$ be a point such that q≤$p_1$. Let $p_1$ falsify a clause of F with literal x. Let $p_2$ be obtained from $p_1$ by flipping the value of x and falsify a clause of F with literal $\bar{x}$. Then there is a non-{x}-clause of F falsified by $p_1$ and $p_2$ such that $Vars(C) \cap X \subseteq Vars(g)$.

The set $X'_{red}$ consists of all the variables already proved redundant in $F_g$. That is every redundant variable $x^*$ of $X_{red}$ with D-sequent $(F, X^*_{red}, g^*) \rightarrow \{x^*\}$ such that $g^* \leq g$, $X^*_{red} \subset X_{red}$ is in $X'_{red}$.

Proof: Assume the contrary i.e. D-sequent $(F, X'_{red}, g) \rightarrow \{x\}$ does not hold, and so variable x is not redundant in $Dis(F_g, X'_{red})$. Hence there is a point p, $g \leq p$ that is a removable $\{x\}$-boundary point of $Dis(F_g, X'_{red})$.

Let C be an $\{x\}$-clause of F. Note that $Dis(F_g, X'_{red})$ cannot contain the clause $C_g$ if the clause $C_q$ is not in $Dis(F_q, X_{red})$. If $C_q$ is not in $Dis(F_q, X_{red})$, then g either satisfies C or C contains a variable of $X_{red}$ that is also in $X'_{red}$ (and hence $C_g$ contains a redundant variable and so is not in $Dis(F_g, X'_{red})$).

So, for p to be an $\{x\}$-boundary point of $F_g$, there have to be $\{x\}$-clauses A and B of F such that:

they are not satisfied by g and do not contain variables of $X'_{red}$ (so the clauses $A_g$ and $B_g$ are in $Dis(F_g, X'_{red})$).

A is falsified by p and B is falsified by the point obtained from p by flipping the value of x.

Let point $p_1$ be obtained from p by flipping assignments to the variables of Vars(q)/Vars(g) that disagree with q. By construction $g \leq p_1$ and $q \leq p_1$. Let $p_2$ be the point obtained from $p_1$ by flipping the value of x. Since x is not assigned in q (and hence is not assigned in g), $g \leq p_2$ and $q \leq p_2$. Then $A_q$ and $B_q$ are also in $F_q$. As Applicants mentioned above A and B cannot contain variables of $X_{red}$ (otherwise they could not be in $F_g$). So A and B are also in $Dis(F_q, X_{red})$.

Note that clause A is falsified by $p_1$. Assume the contrary, i.e. that A is satisfied by $p_1$. Then the fact that p and $p_1$ are different only in assignments to q and that p falsifies A implies that q satisfies A. But then by construction, g has to satisfy A and Applicants have contradiction. Since B is also an $\{x\}$-clause as A, one can use the same reasoning to show that $p_2$ falsifies B.

Since $p_1$ and $p_2$ falsify $\{x\}$-clauses A and B and $q \leq p_1$ and $q \leq p_2$ one can apply Condition 2 of the proposition at hand. That is there must be a clause C falsified by $p_1$ and $p_2$ such that g contains all the assignments of q that falsify literals of C. This means that C is not satisfied by g. Besides, since due to Condition 2 every variable of Vars(C)∩X is in Vars(g), every variable of $C_g$ is in Y. Hence a variable of $C_g$ cannot be redundant. This means that $C_g$ is in $Dis(F_g, X'_{red})$. Since p and $p_1$ have identical assignments to the variables of Y, then p falsifies $C_g$ too. So p cannot be an $\{x\}$-boundary point of $Dis(F_g, X'_{red})$. Contradiction.

11.5 Proofs of Section 6

Lemma 8 Let $(F, X', g) \rightarrow X''$ be a D-sequent derived by DDS_impl and q be the partial assignment when this D-sequent is derived. Let variables of X' be irredundant in $F_g$ or variables of X'' be irredundant in $Dis(F_g, X')$. Then this irredundancy is only local. (See Definition 18 and Remarks 8 and 9.)

Proof: Applicants carry out the proof by induction in the number of D-sequents. The base step is that the statement holds for an empty set of D-sequents, which is vacuously true. The inductive step is to show that the fact that the statement holds for D-sequents $S_1, \ldots, S_n$ implies that it is true for $S_{n+1}$. Let us consider all possible cases.

$S_{n+1}$ is a D-sequent $(F, X', g) \rightarrow \{x\}$ for a monotone variable x of $Dis(F_g, X')$ where $x \in (X \setminus Vars(q) \cup X')$. Since formula $Dis(F_g, X')$ cannot have removable $\{x\}$-boundary points (see Proposition 2), variable x cannot be irredundant in $Dis(F_g, X')$. The variables of X' may be irredundant in $F_g$. However, this irredundancy can be only local. Indeed, using Lemma 7 and the induction hypothesis one can show that variables proved redundant for $F_g$ according to the relevant D-sequents of the set $\{S_1, \ldots, S_n\}$ are indeed redundant in $F_g$ modulo local irredundancy.

$S_{n+1}$ is a D-sequent $(F, \emptyset, g) \rightarrow X'$ derived due to appearance of an empty clause C in $F_g$. Here g is the minimum subset of assignments of q falsifying C. In this case, $F_g$ has no boundary points and hence the set X' of unassigned variables of $F_g$ cannot be irredundant.

$S_{n+1}$ is a D-sequent $(F, X', g) \rightarrow \{x\}$ derived after making the only unassigned variable x of $Dis(F_q, X_{red})$ redundant by adding resolvents on variable x. (As usual, $X_{red}$ denotes the set of redundant variables already proved redundant in $F_q$.) In this case, every removable $\{x\}$-boundary point of $Dis(F_q, X_{red})$ is eliminated and so the latter cannot be irredundant in x. Due to Proposition 8, the same applies to $Dis(F_g, X')$. To show that irredundancy of variables of X' in $F_g$ can be only local one can use the same reasoning as in the case when x is a monotone variable.

$S_{n+1}$ is obtained by resolving D-sequents $S_i$ and $S_j$ where $1 \leq i, j \leq n$ and $i \neq j$. Let $S_i$, $S_j$ and $S_{n+1}$ be equal to $(F, X_i, q_i) \rightarrow X''$, $(F, X_j, q_j) \rightarrow X''$ and $(F, X', g) \rightarrow X''$ respectively where $X' = X_i \cap X_j$ and g is obtained by resolving $q_i$ and $q_j$ (see Definition 11).

Let us first show that irredundancy of X'' in $Dis(F_g, X')$ can only be local. Let p be a removable $X''^*$-boundary point of $Dis(F_g, X')$ where $X''^* \subset X''$.

Then either $q_i \leq p$ or $\overline{q_j} \leq p$. Assume for the sake of clarity that $q_i \leq p$. Consider the following two cases.

p is not removable in $Dis(F_{q_i}, X_i)$. Then the irredundancy of X'' in $Dis(F_g, X')$ due to point p is local. (A point satisfying $Dis(F_{q_i}, X_i)$ can be obtained from p by changing values of some variables from $(X \setminus Vars(q_i) \cup X_i)$. The same point satisfies $Dis(F_g, X')$ because $g \leq q_i$ and $X' \subset X_i$.)

p is also removable in $Dis(F_{q_i}, X_i)$. This means that the variables of X' are irredundant in $Dis(F_{q_i}, X_i)$. By the induction hypothesis, this irredundancy is local. Then one can turn p into a satisfying assignment of F by changing assignments to variables of X. Hence the irredundancy of X'' in $Dis(F_g, X')$ due to point p is also local.

Now, let us show that irredundancy of X' in $F_g$ can only be local. Let p be a removable $X'^*$-boundary point of $F_g$ where $X'^* \subset X'$. Again, assume for the sake of clarity that $q_i \leq p$. Consider the following two cases.

p is not removable in $F_{q_i}$. Then the irredundancy of X' in $F_q$ due to point p is local. (A point satisfying $F_{q_i}$ can be obtained by from p by changing values of some variables from $X \setminus Vars(q_i)$. The same point satisfies $F_g$ because $g \leq q_i$.)

p is also removable in $F_{q_i}$. This means that the variables of X' (and hence the variables of $X_i$) are irredundant in $F_{q_i}$. By the induction hypothesis, this irredundancy is local. Then one can turn p into a satisfying assignment of F by changing assignments to variables of X. Hence the irredundancy of X' in $F_q$ due to point p is also local.

Remark 10 Note that correctness of the final D-sequent $(F, \emptyset, \emptyset) \rightarrow X$ modulo local irredundancy implies that the variables of X are redundant in F. In this case, there is no difference between just redundancy and redundancy modulo local irredundancy because q is empty. (So the value of any variable of X can be changed when checking if a boundary point is removable.)

Lemma 9 Let F(X,Y) be a CNF formula and $X = \{x_1, \ldots, x_k\}$. Let $S_1, \ldots, S_k$ be D-sequents where $S_i$ is the D-sequent $\emptyset \rightarrow \{x_i\}$. Assume that $S_1$ holds for the formula F, $S_2$ holds for the formula $Dis(F, \{x_1\}), \ldots, S_k$ holds for the formula $Dis(F, \{x_1, \ldots, x_{k-1}\})$. (To simplify the notation Applicants assume that D-sequents $S_i$ have been derived in the order they are numbered). Then the variables of X are redundant in F(X,Y).

Proof: Since $S_1$ holds, due to Proposition 3, the formula ∃X.F is equivalent to ∃(X\{$x_1$}). Dis(F,{$x_1$}). Since $S_2$ holds for Dis(F,{$x_1$}) one can apply Proposition 3 again to show that ∃(X\{$x_1$}). Dis(F,{$x_1$}) is equivalent to ∃(X\{$x_1,x_2$}). Dis(F,{$x_1,x_2$}) and hence the latter is equivalent to ∃X.F. By applying Proposition 3 k–2 more times one shows that ∃X.F is equivalent to Dis(F,X). According to Corollary 1, this means that the variables of X are redundant in F(X,Y).

Proposition 9 DDS_impl is sound and complete.

Proof: First, Applicants show that DDS_impl is complete. DDS_impl builds a binary search tree and visits every node of this tree at most three times (when starting the left branch, when backtracking to start the right branch, when backtracking from the right branch). So DDS_impl is complete.

Now Applicants prove that DDS_impl is sound. The idea of the proof is to show that all D-sequents derived by DDS_impl are correct. By definition, DDS_impl eventually derives correct D-sequents ∅→{x} for every variable of X. From Lemma 9 it follows that this is equivalent to derivation of the correct D-sequent ∅→X.

Applicants prove the correctness of D-sequents derived by DDS_impl by induction. The base statement is that the D-sequents of an empty set are correct (which is vacuously true). The induction step is that to show that if first n D-sequents are correct, then next D-sequent S is correct too. Let us consider the following alternatives.

S is a D-sequent built for a monotone variable of Dis($F_q$, $X_{red}$). The correctness of S follows from Proposition 8 and the induction hypothesis (that the D-sequents derived before are correct).

S is the D-sequent specified by a locally empty clause. In this case, S is trivially true.

S is a D-sequent derived by DDS_impl in the BPE state for variable x after eliminating {x}-removable {x}-boundary points of Dis($F_q$, $X_{red}$). The correctness of S follows form Proposition 8 and the induction hypothesis.

S is obtained by resolving two existing D-sequents. The correctness of S follows from Proposition 7 and the induction hypothesis.

11.6 Proofs of Section 7

Definition 19 Let Proof be a resolution proof that a CNF formula H is unsatisfiable. Let $G_{proof}$ be the resolution graph specified by Proof. (The sources of $G_{proof}$ correspond to clauses of H. Every non-source node of $G_{proof}$ corresponds to a resolvent of Proof. The sink of $G_{proof}$ is an empty clause. Every non-source node of $G_{proof}$ has two incoming edges connecting this note to the nodes corresponding to the parent clauses.) Applicants will call Proof irredundant, if for every node of $G_{proof}$ there is a path leading from this node to the sink.

Lemma 10 Let F(X,Y) be equal to $F_1(X_1,Y_1)$ ∧ . . . ∧ $F_k(X_k,Y_k)$ where $(X_i∪Y_i)∩(X_j∪Y_j)$=∅, i≠j. Let F be satisfiable. Let F have no {x}-removable {x}-boundary points where x∈$X_i$ and Proof be a resolution proof of that fact built by DDS_impl. Then Proof does not contain clauses of $F_j$, j≠i (that is no clause of $F_j$ is used as a parent clause in a resolution of Proof).

Proof: DDS_impl concludes that all {x}-removable {x}-boundary points have been eliminated if the CNF formula H described in Subsection 6.3 is unsatisfiable. H consists of clauses of the current formula Dis($F_q$, $X_{red}$) and the clauses of CNF formula $H_{dir}$. DDS_impl builds an irredundant resolution proof that H is unsatisfiable. (Making Proof irredundant is performed by function optimize of FIG. 4.)

Since formula F is the conjunction of independent subformulas, clauses of $F_i$ and $F_j$, j≠i cannot be resolved with each other. The same applies to resolvents of clauses of $F_i$ and $F_j$ and to resolvents of clauses of $F_i \wedge H_{dir}$ and $F_j$. (By construction [8], $H_{dir}$ may have only variables of {x}-clauses of F and some new variables i.e. ones that are not present in F. Since x∈$X_i$, this means that the variables of $H_{dir}$ can only overlap with those of $F_i$.) Therefore, an irredundant proof of unsatisfiability of H has to contain only clauses of either formula $F_j$, j≠i or formula $F_i \wedge H_{dir}$. Formula F is satisfiable, hence every subformula $F_j$, j=1, . . . , k is satisfiable too. So, a proof cannot consists solely of clauses of $F_j$, j≠i. This means that Proof employs only clauses of $F_i \wedge H_{dir}$ (and their resolvents).

Proposition 10 DDS_impl is compositional regardless of how branching variables are chosen.

Proof: The main idea of the proof is to show that every D-sequent generated by DDS_impl has the form g→X' where Vars (g) ⊂ X, and X' ⊂ X. Applicants will call such a D-sequent limited to $F_i$. Let us carry on the proof by induction. Assume that the D-sequents generated so far are limited to $F_i$ and show that this holds for the next D-sequent S. Since one cannot resolve clauses of $F_i$ and $F_j$, i≠j, if S is specified by a clause that is locally empty, S is limited to $F_i$.

Let S be a D-sequent generated for a monotone variable x∈$X_i$. According to Remark 4, only Condition 1 contributes to forming g. In this case, Vars (g) consists of
variables of {x}-clauses of F and
variables of Vars (g*) of D-sequents g*→{x*} showing redundancy of variables x* of {x}-clauses of F.

Every {x}-clause of F is either a clause of the original formula $F_i$ or its resolvent. So the variables that are in g due to the first condition above are in $X_i$. By the induction hypothesis, the variables of Vars (g*) are also in $X_i$.

Let S be obtained after eliminating {x}-removable {x}-boundary points where x∈$X_i$ (see Subsection 6.3). Denote by $g_1$ and $g_2$ the two parts of g specified by Condition 1 and 2 of Proposition 8. (Assignment g is the union of assignments $g_1$ and $g_2$.) The variables of Vars ($g_1$) are in $X_1$ for the same reasons as in the case of monotone variables.

To generate $g_2$, DDS_impl uses proof Proof that formula H built from clauses of F and $H_{dir}$ (see Subsection 6.3) is unsatisfiable. As Applicants showed in Lemma 10, Proof employs only clauses of $F_i \wedge H_{dir}$ and their resolvents. Only clauses of formula F are taken into account when forming $g_2$ in Proposition 8 (i.e. clauses of $H_{dir}$ do not affect $g_2$). Since the only clauses of F used in Proof are those of $F_i$, then Vars ($g_2$) ⊂ $X_i$.

Finally, if S is obtained by resolving two D-sequents limited to $F_i$, it is also limited to $F_i$ (see Definition 12).

What is claimed is:

1. A method for designing circuits, the method comprising:
providing, using a microprocessor, a first quantified conjunctive normal form formula;
determining dependency sequents for the left branch and the right branch of a branching variable;
determining whether both branches of the branching variable are unsatisfied; and
designing a circuit using a current formula having less variables than the first quantified conjunctive normal formula.

2. The method of claim 1, wherein determining dependency sequents for the left branch and the right branch of a branching variable comprises:
picking a variable to be a branching variable, wherein the picked variable was not previously picked for branching, was not previously proven redundant at a current node, and was not found detached.

3. The method of claim 2, wherein determining dependency sequents for the left branch and the right branch of a branching variable further comprises:
  exploring an entire left branch of the branching variable to compute dependency sequents for all unassigned non-redundant quantified variables and determine whether the current formula is satisfiable or unsatisfiable.

4. The method of claim 3, wherein determining dependency sequents for the left branch and the right branch of a branching variable further comprises:
  determining a first set of quantified variables whose dependency sequents depend on an assignment to the picked variable.

5. The method of claim 4, wherein determining dependency sequents for the left branch and the right branch of a branching variable further comprises:
  marking the first set of quantified variables as non-redundant.

6. The method of claim 5, wherein determining dependency sequents for the left branch and the right branch of a branching variable further comprises:
  exploring an entire right branch of the branching variable to compute dependency sequents for all unassigned non-redundant quantified variables, and to determine whether the current formula is satisfiable or unsatisfiable.

7. The method of claim 1, further comprising: determining that both branches of the branching variable are unsatisfied; and upon a determination that a left clause falsified in the left branch and a right clause falsified in the right branch both depend upon the branching variable, producing a resolvent clause by resolving the left clause and the right clause upon the branching variable.

8. The method of claim 7, further comprising:
  adding the resolvent clause to the current formula.

9. The method of claim 8, further comprising:
  building a dependency sequent for every unassigned quantified variable.

10. The method of claim 9, further comprising:
  returning the current formula, the dependency sequents, the answer unsatisfiable, and the resolvent clause.

11. The method of claim 1, further comprising:
  determining that at least one branch of the branching variable is satisfied; and producing a new dependency sequent for every unassigned quantified variable whose dependency sequent returned in the right branch depends on the branching variable,
  wherein each new dependency sequent is generated by resolving dependency sequents obtained in the branches of a corresponding unassigned quantified variable.

12. The method of claim 11, further comprising:
  making the branching variable redundant by resolving some clauses that are currently not redundant and not satisfied, wherein only resolvents producing clauses that eliminate boundary points relevant to the branching variable are added;
  generating a dependency sequent for the branching variable; and
  marking the branching variable as redundant.

13. The method of claim 12, further comprising:
  returning the current formula, the dependency sequents, and the answer satisfiable.

14. The method of claim 1, further comprising, before determining dependency sequents for the left branch and the right branch of the branching variable:
  testing variables for redundancy by using at least one trivial method.

15. The method of claim 14, wherein testing variables by using at least one trivial method comprises:
  determining whether the current formula contains a clause falsified by a current assignment.

16. The method of claim 15, further comprising:
  upon a determination that the current formula contains a clause unsatisfied by the current assignment, building a dependency sequent for every unassigned non-redundant quantified variable, and marking every unassigned non-redundant quantified variable as redundant; and
  returning the current formula, the dependency sequents, the answer unsatisfiable, and the unsatisfied clause.

17. The method of claim 15, further comprising:
  upon a determination that the current formula does not contain a clause unsatisfied by the current assignment, build a dependency sequent for, and mark as redundant, every unassigned non-redundant quantified variable whose redundancy can be trivially proved.

18. The method of claim 17, further comprising:
  determining whether every unassigned quantified variable is redundant.

19. The method of claim 1, further comprising:
  building a circuit using the current formula.

20. The method of claim 1, further comprising:
  providing a first conjunctive normal form (CNF) formula $F(X,Y)$ describing a first circuit;
  wherein:
    X is a first subset of a set of variables of $F(X,Y)$,
    Y is a second subset of the set of variables of $F(X,Y)$,
    $X \cup Y$ describes a complete set of variables of $F(X,Y)$ including the first subset and the second subset, and
    all variables in X are bound by at least one existential quantifier;
  obtaining a second conjunctive normal form formula $F^*(Y)$ from $F(X,Y)$ by eliminating at least one existentially quantified variable x of X such that $F(X,Y) \equiv F^*(Y)$;
  wherein:

$$F^*(y)=1 \rightarrow \exists x, F(x,y)=1, \text{ and}$$

$$F^*(y)=0 \rightarrow \forall x, F(x,y)=0;$$

wherein x and y are complete assignments to variables of X and Y respectively;
  wherein the second conjunctive normal form formula $F^*(Y)$ is obtained by:
    searching for a boundary point by branching on at least one existentially quantified variable x of $F(X,Y)$, and learning a dependency sequent during branching;
  wherein a dependency sequent is an expression $q \rightarrow x$, such that variable x of X is redundant in $F(X,Y)$ under partial assignment q to variables of X; and
  designing a circuit using $F^*(Y)$.

21. The method of claim 20, further comprising:
  eliminating a X'-boundary point by adding, to $F(X,Y)$, a clause C that is implied by $F(X,Y)$ and does not have a variable of X'; and
  terminating the boundary point elimination upon a determination that a current $F(X,Y)$ has no removable boundary points.

22. The method of claim 20, further comprising:
  building a circuit using $F^*(Y)$.

23. The method of claim 1, further comprising:
  providing a first conjunctive normal form (CNF) formula $F(X,Y)$ describing a first circuit;

wherein:
X is a first subset of a set of variables of F(X,Y),
Y is a second subset of the set of variables of F(X,Y),
X∪Y describes a complete set of variables of F(X,Y) including the first subset and the second subset, and
all variables in X are bound by at exactly one existential quantifier;

obtaining a second conjunctive normal form formula F*(Y) from F(X,Y) by eliminating every existentially quantified variable x of X such that F(X,Y)=F*(Y);

wherein:

$$F^*(y)=1 \rightarrow \exists x, F(x,y)=1, \text{ and}$$

$$F^*(y)=0 \rightarrow \forall x, F(x,y)=0;$$

wherein x and y are complete assignments to variables of X and Y respectively;

wherein the second conjunctive normal form formula F*(Y) is obtained by: searching for boundary points by branching on every existentially quantified variable x of F(X,Y), and learning dependency sequents during branching;

wherein a dependency sequent is an expression q→x, such that variable x of X is redundant in F(X,Y) under partial assignment q to variables of X; and designing a circuit using F*(Y).

24. The method of claim 23, further comprising:
eliminating a X'-boundary point by adding, to F(X,Y), a clause C that is implied by F(X,Y) and does not have a variable of X'; and terminating the boundary point elimination upon a determination that a current F(X,Y) has no removable boundary points.

25. The method of claim 23, further comprising:
building a circuit using F*(Y).

* * * * *